(12) United States Patent
Yamaoka et al.

(10) Patent No.: US 12,349,525 B2
(45) Date of Patent: *Jul. 1, 2025

(54) LIGHT EMITTING MODULE AND METHOD FOR MANUFACTURING LIGHT EMITTING MODULE

(71) Applicant: NICHIA CORPORATION, Anan (JP)

(72) Inventors: Kensuke Yamaoka, Tokushima (JP); Daisuke Sanga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 522 days.

This patent is subject to a terminal disclaimer.

(21) Appl. No.: 17/834,571

(22) Filed: Jun. 7, 2022

(65) Prior Publication Data
US 2022/0416140 A1    Dec. 29, 2022

(30) Foreign Application Priority Data

Jun. 23, 2021 (JP) ................................ 2021-104304

(51) Int. Cl.
*H10H 20/857* (2025.01)
*H10H 20/01* (2025.01)
*H10H 20/831* (2025.01)

(52) U.S. Cl.
CPC .......... *H10H 20/857* (2025.01); *H10H 20/01* (2025.01); *H10H 20/8312* (2025.01); *H10H 20/032* (2025.01); *H10H 20/0364* (2025.01)

(58) Field of Classification Search
CPC ..... H01L 33/62; H01L 33/005; H01L 33/382; H10H 20/857; H10H 20/01; H10H 20/8312

See application file for complete search history.

(56) References Cited

U.S. PATENT DOCUMENTS

| | | | |
|---|---|---|---|
| 6,077,765 A | 6/2000 | Naya | |
| 9,559,279 B1 | 1/2017 | Tomizawa et al. | |
| 2003/0111727 A1* | 6/2003 | Kurusu | H05K 1/111 257/730 |
| 2004/0256631 A1 | 12/2004 | Shin | |
| 2005/0104220 A1* | 5/2005 | Tsuchiya | H01L 23/293 257/E21.511 |
| 2005/0168992 A1* | 8/2005 | Hirose | H01L 33/405 362/296.04 |

(Continued)

FOREIGN PATENT DOCUMENTS

| | | |
|---|---|---|
| JP | S63-122248 A | 5/1988 |
| JP | H04-217323 A | 8/1992 |

(Continued)

*Primary Examiner* — Bac H Au

(74) *Attorney, Agent, or Firm* — Foley & Lardner LLP

(57) ABSTRACT

A method for manufacturing a light emitting module includes: providing an intermediate body including: a wiring substrate including a metal layer, a first conductive member, and a second conductive member; disposing a resist layer on the intermediate body; disposing a light-emitting element on the resist layer, the light-emitting element comprising: a first electrode, and a second electrode; forming on the metal layer: a first bonding member in contact with the first conductive member and the first electrode, and a second bonding member separated from the first conductive member and in contact with the second conductive member and the second electrode; and removing the resist layer.

18 Claims, 18 Drawing Sheets

(56) References Cited

U.S. PATENT DOCUMENTS

| | | | |
|---|---|---|---|
| 2008/0310854 A1* | 12/2008 | Takai | H01L 31/02005 |
| | | | 398/139 |
| 2011/0266039 A1* | 11/2011 | Tomoda | H01L 24/73 |
| | | | 156/150 |
| 2012/0169786 A1 | 7/2012 | Okuyama et al. | |
| 2013/0264600 A1 | 10/2013 | Lee et al. | |
| 2014/0008691 A1 | 1/2014 | Tomoda et al. | |
| 2015/0162292 A1* | 6/2015 | Machida | H01L 24/11 |
| | | | 257/737 |
| 2015/0171281 A1 | 6/2015 | Nakabayashi et al. | |
| 2016/0218262 A1 | 7/2016 | Aketa et al. | |
| 2017/0098740 A1 | 4/2017 | Ohmae et al. | |
| 2017/0279019 A1 | 9/2017 | Ueda et al. | |
| 2020/0302835 A1 | 9/2020 | Ohmae et al. | |
| 2020/0343408 A1* | 10/2020 | Sakamaki | H01L 25/0753 |
| 2023/0207762 A1* | 6/2023 | Sato | H01L 33/005 |
| | | | 257/79 |

FOREIGN PATENT DOCUMENTS

| | | |
|---|---|---|
| JP | H07-183304 A | 7/1995 |
| JP | H07-273117 A | 10/1995 |
| JP | H07-335648 A | 12/1995 |
| JP | H08-148531 A | 6/1996 |
| JP | H09-275108 A | 10/1997 |
| JP | H10-125685 A | 5/1998 |
| JP | 2001-044498 A | 2/2001 |
| JP | 2005-019939 A | 1/2005 |
| JP | 2006-140247 A | 6/2006 |
| JP | 2008-124376 A | 5/2008 |
| JP | 2011-233733 A | 11/2011 |
| JP | 2012-142489 A | 7/2012 |
| JP | 2014-013818 A | 1/2014 |
| JP | 2015-073060 A | 4/2015 |
| JP | 2015-195244 A | 11/2015 |
| JP | 2015-207754 A | 11/2015 |
| JP | 2016-127255 A | 7/2016 |
| JP | 2017-041612 A | 2/2017 |
| JP | 2017-183458 A | 10/2017 |
| JP | 2021-103774 A | 7/2021 |
| WO | WO-2021/132392 A1 | 7/2021 |

\* cited by examiner

LIGHT EMITTING MODULE AND METHOD FOR MANUFACTURING LIGHT EMITTING MODULE

CROSS-REFERENCE TO RELATED APPLICATION

This application claims priority to Japanese Patent Application No. 2021-104304, filed on Jun. 23, 2021, the disclosure of which is hereby incorporated by reference in its entirety.

BACKGROUND

The present disclosure relates to a light emitting module and a method for manufacturing the light emitting module.

In recent years, a light emitting module including a large number of light-emitting elements mounted on a wiring substrate has been developed. Improvement of productivity is desired in such a light emitting module. (See, for example, Japanese Patent Publication No. 1996-148531)

SUMMARY

It is an object of the embodiment of the present disclosure to provide a method for manufacturing a light emitting module with high productivity, and a light emitting module manufactured by such a method.

A method for manufacturing a light emitting module according to an embodiment of the present disclosure includes providing an intermediate body that includes a wiring substrate including an upper surface and a metal layer disposed on the upper surface of the wiring substrate, a first conductive member disposed on and in contact with the metal layer, and a second conductive member separated from the first conductive member and disposed on and in contact with the metal layer. The method includes disposing a resist layer on the intermediate body such that at least a portion of the resist layer is located between the first conductive member and the second conductive member. The method includes disposing a light-emitting element including a lower surface, a first electrode disposed on the lower surface, and a second electrode disposed on the lower surface on the resist layer such that the lower surface of the light-emitting element faces the upper surface of the wiring substrate. The method includes forming a first bonding member in contact with the first conductive member and the first electrode on the metal layer, and forming a second bonding member separated from the first conductive member and in contact with the second conductive member and the second electrode. The method includes removing the resist layer.

A light emitting module according to an embodiment of the present disclosure includes a wiring substrate, a first conductive member, a second conductive member, a first bonding member, a second bonding member, and a light-emitting element. The wiring substrate includes an upper surface, a first metal layer provided on the upper surface of the wiring substrate, and a second metal layer provided on the upper surface of the wiring substrate. The first conductive member is provided on and in contact with the first metal layer. The second conductive member is provided on and in contact with the second metal layer. The first bonding member is provided on the first metal layer, covers the first conductive member, and is in contact with the first metal layer and the first conductive member. The second bonding member is provided on the second metal layer, covers the second conductive member, and is in contact with the second metal layer and the second conductive member. The light-emitting element includes a lower surface, a first electrode provided on the lower surface and in contact with the first bonding member, and a second electrode provided on the lower surface and in contact with the second bonding member, with the lower surface of the light-emitting element facing the upper surface of the wiring substrate.

According to embodiments of the present disclosure, a method for manufacturing a light emitting module with high productivity, and a light emitting module manufactured by such a method are provided.

DETAILED DESCRIPTION

Figure 1:
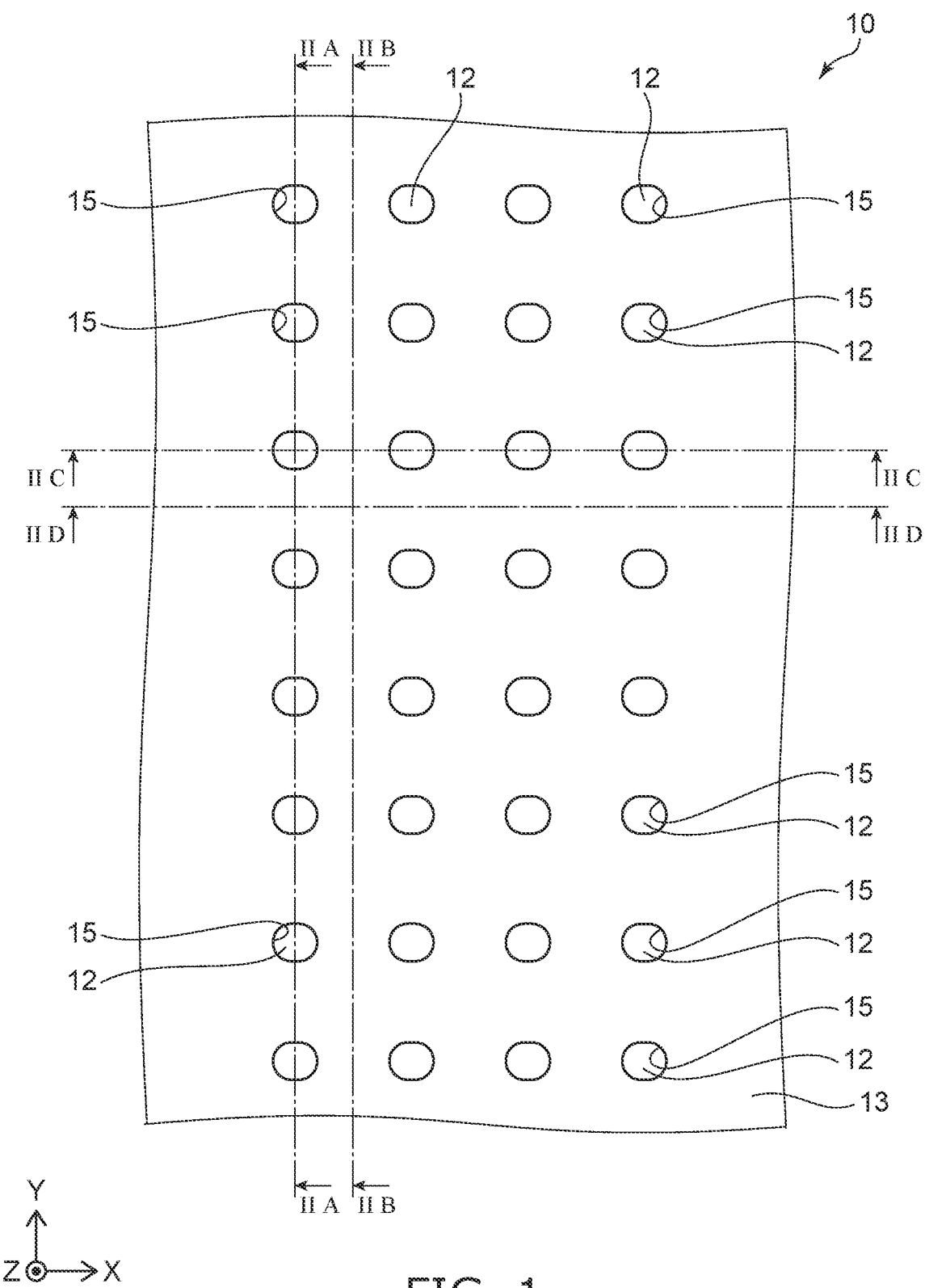
FIG. 1 is a schematic plan view illustrating a method for manufacturing a light emitting module according to an embodiment.

Embodiments of the present disclosure will be described below with reference to the accompanying drawings. The drawings are illustrated schematically and may be exaggerated or simplified as appropriate. The dimensional ratios of components are not necessarily consistent throughout the drawings.

First, a method for manufacturing a light emitting module according to the present embodiment will be described.

The method for manufacturing a light emitting module 1 according to the present embodiment includes providing an intermediate body 20 including a wiring substrate 10 including an upper surface 16 and a metal layer 14 disposed on the upper surface 16, a first conductive member 21 disposed on and in contact with the metal layer 14, and a second conductive member 22 separated from the first conductive member 21 and disposed on and in contact with the metal layer 14, disposing a resist layer 30 on the intermediate body 20 such that at least a portion of the resist layer 30 is located between the first conductive member 21 and the second conductive member 22, disposing on the resist layer 30 a light-emitting element 40 including a lower surface 41, a first electrode 46 disposed on the lower surface 41, and a second electrode 47 disposed on the lower surface 41 such that the lower surface 41 of the light-emitting element 40 faces the upper surface 16 of the wiring substrate 10, and forming on the metal layer 14 a first bonding member 51 in contact with the first conductive member 21 and the first electrode 46, and forming on the metal layer 14 a second bonding member 52 separated from the first conductive member 21 and in contact with the second conductive member 22 and the second electrode 47, and removing the resist layer 30.

Providing Intermediate Body

In the step of providing the intermediate body, the wiring substrate 10 is provided.

FIG. 1 is a schematic plan view illustrating a method for manufacturing the light emitting module according to the present embodiment.

Figure 2A:
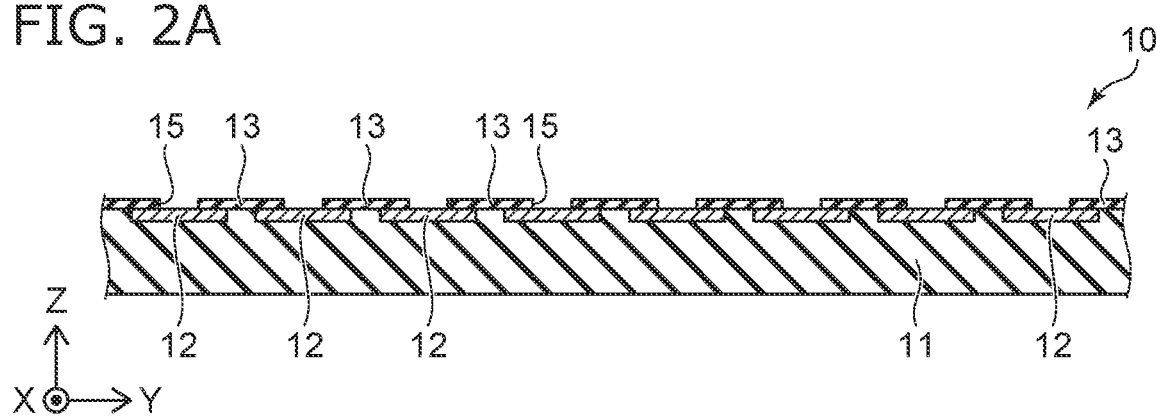
FIG. 2A is a schematic end view taken along line IIA-IIA illustrated in FIG. 1.

FIG. 2A is a schematic end view taken along line IIA-IIA illustrated in FIG. 1.

Figure 2B:
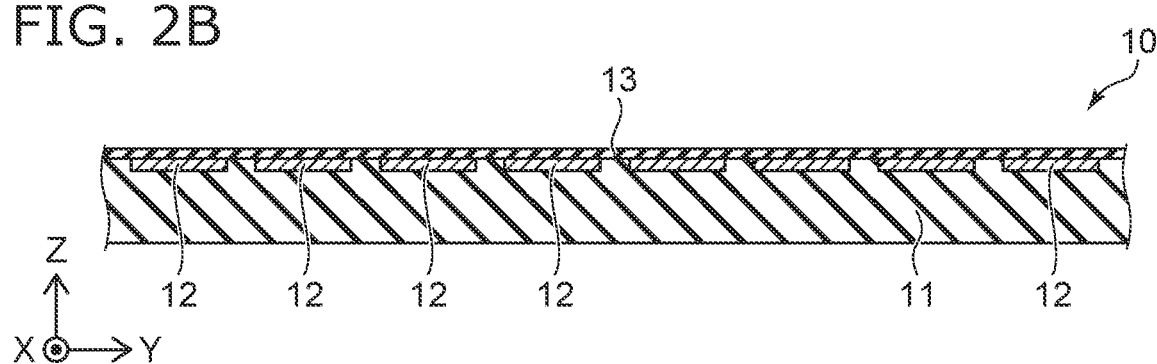
FIG. 2B is a schematic end view taken along line IIB-IIB illustrated in FIG. 1.

FIG. 2B is a schematic end view taken along line IIB-IIB illustrated in FIG. 1.

Figure 2C:
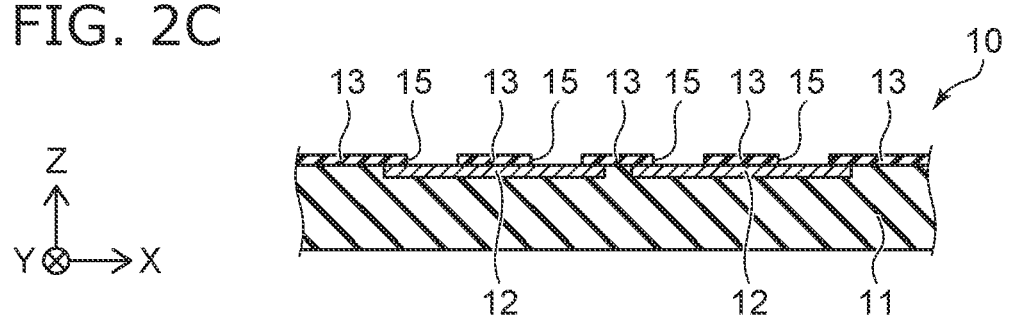
FIG. 2C is a schematic end view taken along line IIC-IIC illustrated in FIG. 1.

FIG. 2C is a schematic end view taken along line IIC-IIC illustrated in FIG. 1.

Figure 2D:
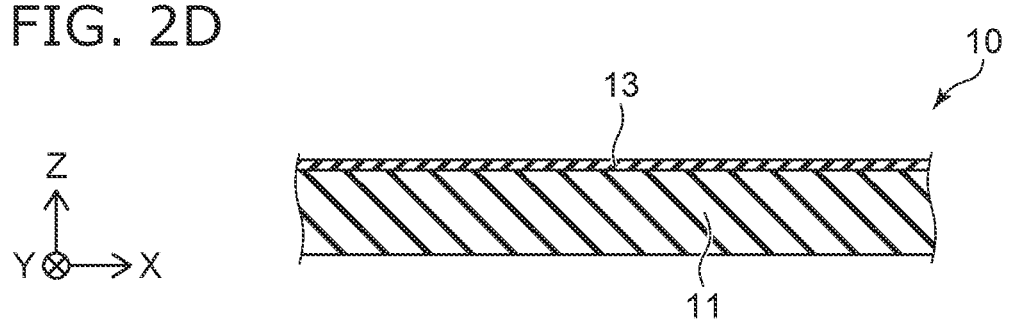
FIG. 2D is a schematic end view taken along line IID-IID illustrated in FIG. 1.

FIG. 2D is a schematic end view taken along line IID-IID illustrated in FIG. 1.

Figure 3:
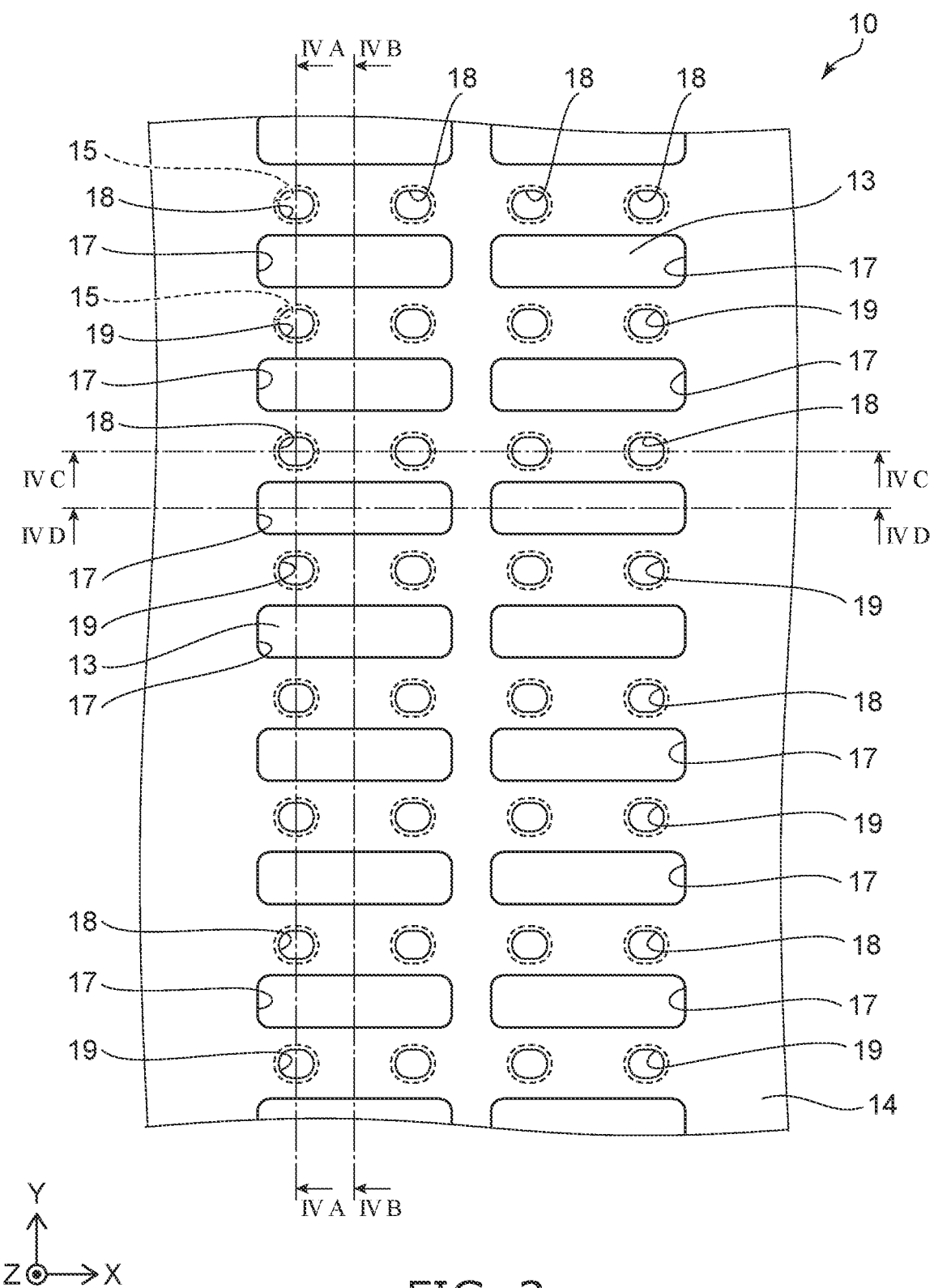
FIG. 3 is a schematic plan view illustrating a method for manufacturing a light emitting module according to the embodiment.

FIG. 3 is a schematic plan view illustrating a method for manufacturing the light emitting module according to the present embodiment.

Figure 4A:
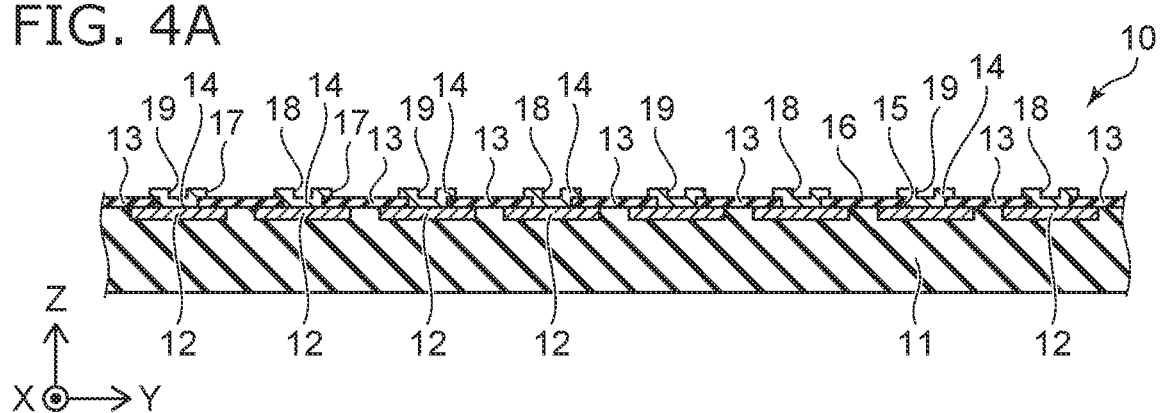
FIG. 4A is a schematic end view taken along line IVA-IVA illustrated in FIG. 3.

FIG. 4A is a schematic end view taken along line IVA-IVA illustrated in FIG. 3.

Figure 4B:
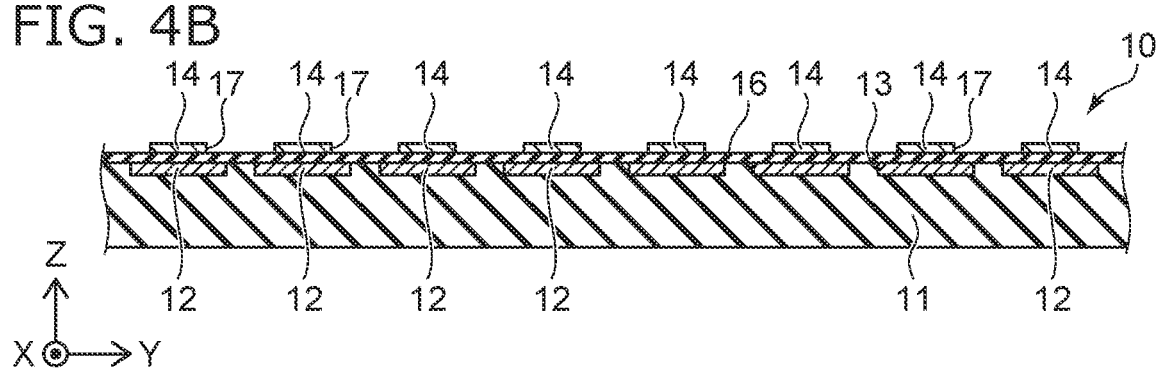
FIG. 4B is a schematic end view taken along line IVB-IVB illustrated in FIG. 3.

FIG. 4B is a schematic end view taken along line IVB-IVB illustrated in FIG. 3.

Figure 4C:
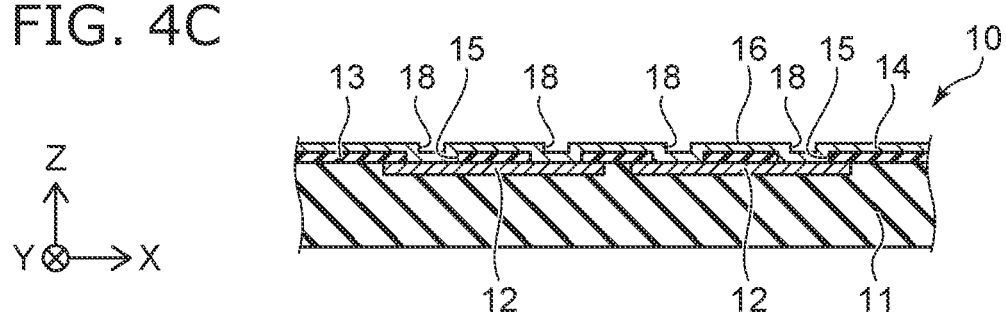
FIG. 4C is a schematic end view taken along line IVC-IVC illustrated in FIG. 3.

FIG. 4C is a schematic end view taken along line IVC-IVC illustrated in FIG. 3.

Figure 4D:
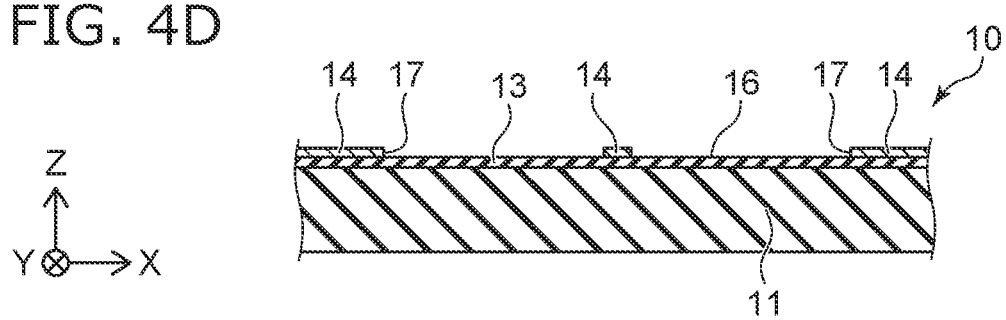
FIG. 4D is a schematic end view taken along line IVD-IVD illustrated in FIG. 3.

FIG. 4D is a schematic end view taken along line IVD-IVD illustrated in FIG. 3.

FIGS. 1 to 4D illustrate the wiring substrate 10. In FIGS. 1 to 2D, the metal layer 14 is omitted for ease of view of the drawings.

As illustrated in FIGS. 1 to 4D, the wiring substrate 10 includes an insulating substrate 11, wirings 12, an insulating film 13, and a metal layer 14. The wiring substrate 10 is, for example, an application specific integrated circuit (ASIC) substrate.

The wirings 12 are disposed in a multi-layered manner in the substrate 11. In FIGS. 2A to 2D, only the uppermost wirings 12 are illustrated, and other wirings 12 are omitted. The same applies to other schematic end views described below. The insulating film 13 is disposed on the upper surface of the substrate 11. The insulating film 13 has a plurality of first openings 15 penetrating through the insulating film 13. For example, the first openings 15 are arrayed in a matrix shape in a plan view. The wirings 12 are exposed at the bottom of the first openings 15. The shape of the first openings 15 is not particularly limited, but may, for example, be a circular shape, an elliptical shape, an oval shape, a rectangular shape with rounded corners, or a rectangular shape.

Hereinafter, an XYZ orthogonal coordinate system is employed throughout the specification for convenience of description. The first openings 15 of the insulating film 13 are arrayed in the "X-direction" and the "Y-direction". The thickness direction of the wiring substrate 10 is the "Z-direction". An expression "in a plan view" as used in the specification indicates a case when viewed in the Z-direction.

As illustrated in FIGS. 3 to 4D, the metal layer 14 is disposed on the insulating film 13, and is disposed on the upper surface 16 of the wiring substrate 10. The metal layer 14 can be formed of a material such as tungsten (W), copper (Cu), nickel (Ni), silver (Ag), gold (Au), palladium (Pd), or platinum (Pt), or an alloy containing one of these materials. For example, copper is preferably used in terms of heat dissipation. The metal layer 14 has a plurality of second openings 17 penetrating through the metal layer 14. For example, the second openings 17 are arrayed in a matrix shape in the X-direction and the Y-direction in a plan view.

The second openings 17 of the metal layer 14 have, for example, a rectangular shape or a substantially rectangular shape with rounded corners in a plan view. The length of the second opening 17 in the X-direction is greater than its length in the Y-direction. The second openings 17 each face, in the Y-direction, two first openings 15 adjacent in the X-direction.

On the wiring substrate 10, the second openings 17 of the metal layer 14 are separated from the first openings 15 of the insulating film 13 in a plan view. Specifically, the second openings 17 are not located between the adjacent first openings 15 in the X-direction, while the first openings 15 are not located between adjacent second openings 17 in the X-direction. On the other hand, the first openings 15 and the second openings 17 are alternately arrayed in the Y-direction. That is, the metal layer 14 collectively covers the plurality of first openings 15 and has the plurality of second openings 17, which penetrate through the metal layer 14, at positions separated from the first openings 15 in a plan view.

Because the first openings 15 and the second openings 17 are separated in a plan view, the first openings 15 of the insulating film 13 are covered with the metal layer 14. Accordingly, the wirings 12 exposed from the insulating film 13 at the bottom of the first openings 15 are covered with and in contact with the metal layer 14. On the other hand, the insulating film 13 is exposed, instead of the wirings 12, at the bottom of the second openings 17.

By covering the first openings 15 of the insulating film 13 with the metal layer 14, recessed portions reflecting the shape of the first openings 15 are made above the first openings 15 in the metal layer 14. In this case, the wiring substrate 10 has the first recessed portions 18 and the second recessed portions 19 on the upper surface of the metal layer 14. Here, the second recessed portions 19 are not disposed between the first recessed portions 18 adjacent in the X-direction, while the first recessed portions 18 are not disposed between the second recessed portions 19 adjacent in the X-direction. On the other hand, the first recessed portions 18 and the second recessed portions 19 are alternately arrayed in the Y-direction.

Specifically, there is a row of the plurality of second openings 17 arrayed in the X-direction between a row of the plurality of first recessed portions 18 arrayed in the X-direction and a row of the plurality of second recessed portions 19 arrayed in the X-direction. In this way, the row of the first recessed portions 18, the row of the second openings 17, the row of the second recessed portions 19, and the row of the second openings 17 are repeatedly arrayed in this order in the Y-direction. In a case in which the metal layer 14 is sufficiently thick compared to the insulating film 13, the first recessed portions 18 and the second recessed portions 19 may not be formed. The metal layer 14, therefore, is preferably thick enough to form the first recessed portions 18 and the second recessed portions 19. Specifically, the thickness of the metal layer 14 may be in a range from 0.10 µm to 0.30 µm, and the depths of the first recessed portions 18 and the second recessed portions 19 are approximately in a range from 0.30 µm to 0.90 µm.

Subsequently, first conductive members 21 and second conductive members 22 are disposed on the metal layer 14.

Figure 5:
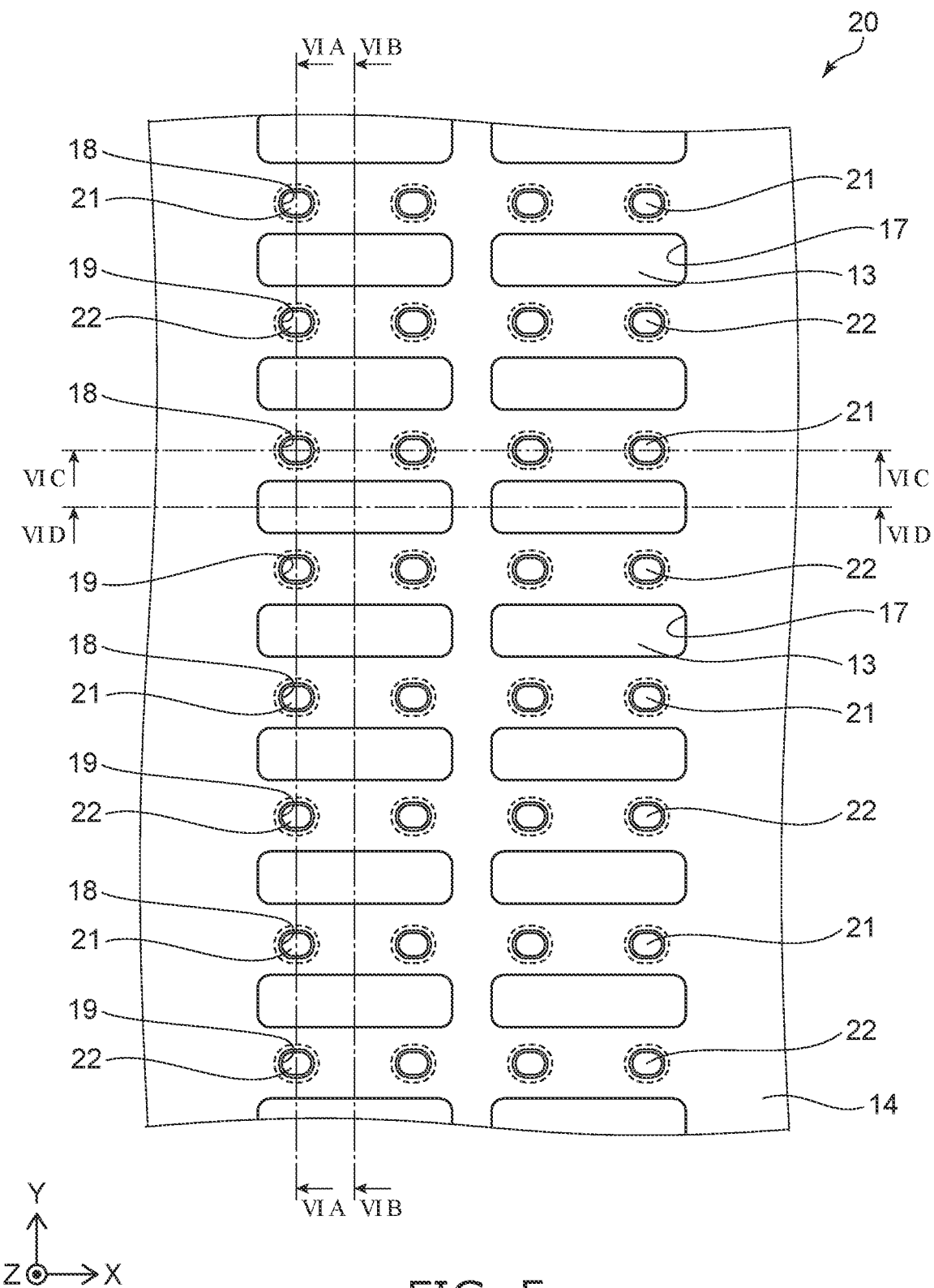
FIG. 5 is a schematic plan view illustrating a method for manufacturing a light emitting module according to the embodiment.

FIG. 5 is a schematic plan view illustrating a method for manufacturing the light emitting module according to the embodiment.

Figure 6A:
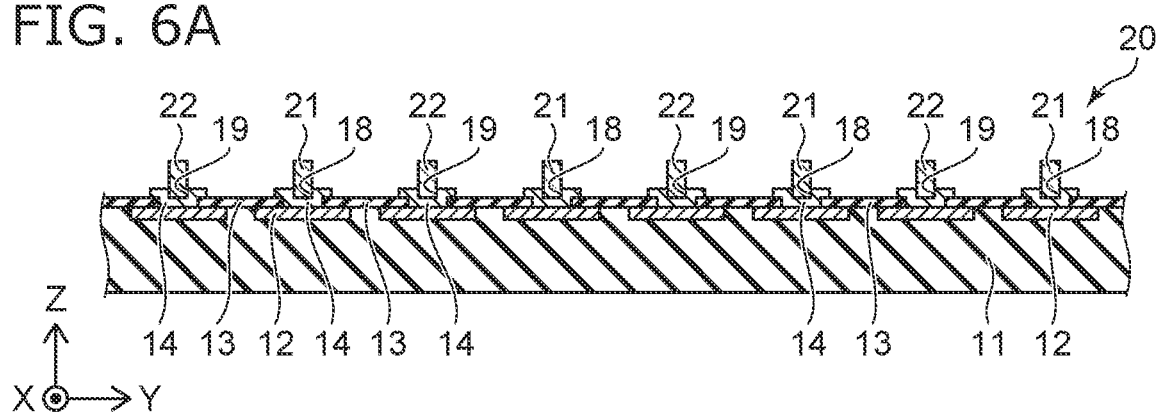
FIG. 6A is a schematic end view taken along line VIA-VIA illustrated in FIG. 5.

FIG. 6A is a schematic end view taken along line VIA-VIA illustrated in FIG. 5.

Figure 6B:
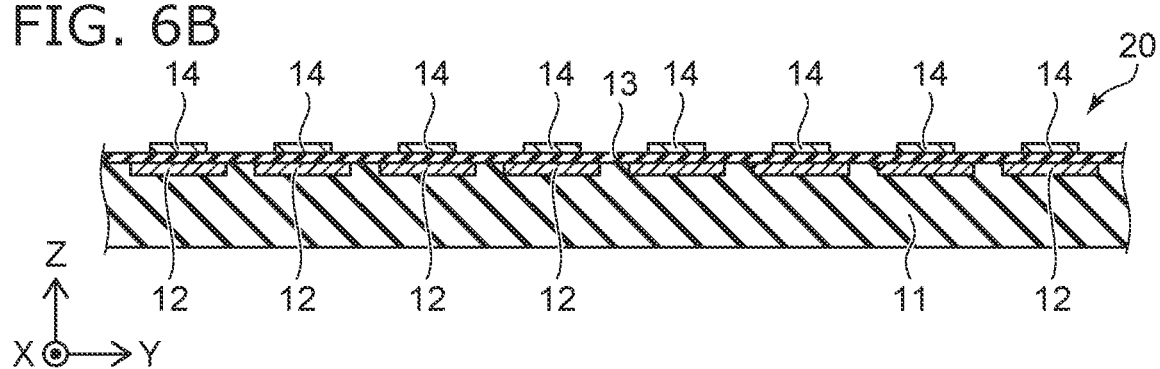
FIG. 6B is a schematic end view taken along line VIB-VIB illustrated in FIG. 5.

FIG. 6B is a schematic end view taken along line VIB-VIB illustrated in FIG. 5.

Figure 6C:
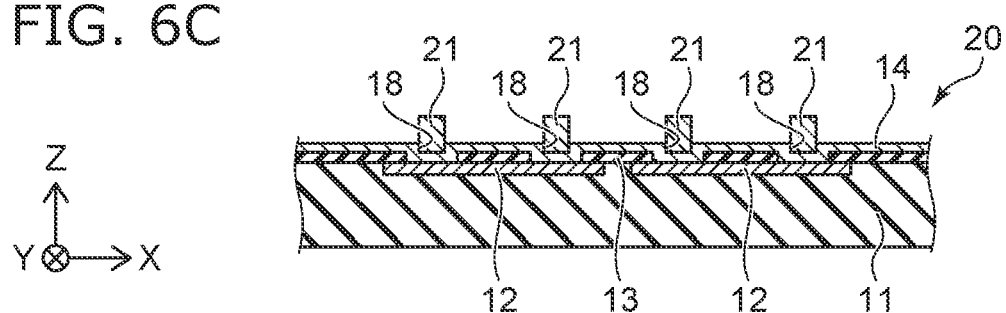
FIG. 6C is a schematic end view taken along line VIC-VIC illustrated in FIG. 5.

FIG. 6C is a schematic end view taken along line VIC-VIC illustrated in FIG. 5.

Figure 6D:
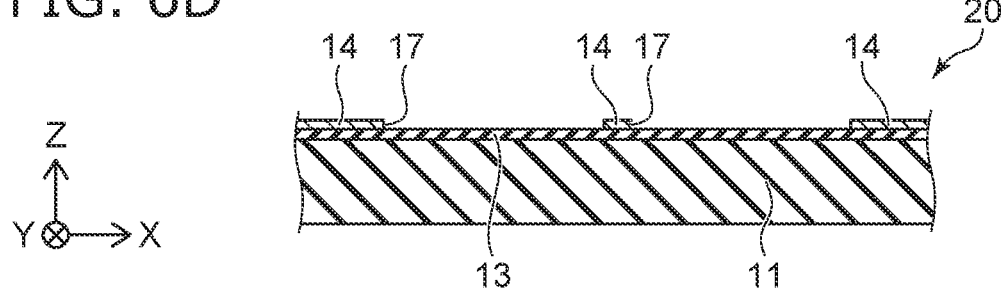
FIG. 6D is a schematic end view taken along line VID-VID illustrated in FIG. 5.

FIG. 6D is a schematic end view taken along line VID-VID illustrated in FIG. 5.

FIGS. 5 to 6D illustrate an intermediate body 20.

As illustrated in FIGS. 5 to 6D, the first conductive members 21 are disposed in the first recessed portions 18 of the metal layer 14, and the second conductive members 22 are disposed in the second recessed portions 19 of the metal layer 14. The first conductive members 21 and the second conductive members 22 can be formed of a material such as tungsten (W), copper (Cu), nickel (Ni), silver (Ag), gold (Au), palladium (Pd), or platinum (Pt), or an alloy containing one of these materials. In particular, copper (Cu) is preferably used in terms of heat dissipation. In one example, the first conductive members 21 and the second conductive members 22 can be formed by electrolytic plating, non-electrolytic plating, sputtering, vapor deposition, or other processes.

The first conductive members 21 and the second conductive members 22 have, for example, a pillar shape such as a column shape, an elliptical column shape, a long column shape, a substantially quadrangular prism with rounded corners, or a quadrangular pillar shape. In a plan view, it is preferable that the first conductive member 21 is encompassed in the first recessed portion 18, and that the outer edge of the first conductive member 21 is the same as or slightly smaller than the outer edge of the bottom of the first recessed portion 18. Likewise, in a plan view, it is preferable that the second conductive member 22 is encompassed in the second recessed portion 19, and that the outer edge of the second conductive member 22 is the same as or slightly smaller than the outer edge of the bottom portion of the second recessed portion 19.

The thickness or the length in the Z-direction of the first conductive member 21 is preferably greater than the depth of the first recessed portion 18. Likewise, the thickness or the length in the Z-direction of the second conductive member 22 is preferably greater than the depth of the second recessed portion 19. This allows the upper end of the first conductive member 21 and the upper end of the second conductive member 22 to be located above the upper surface of the metal layer 14. Specifically, the thicknesses of the first conductive member 21 and the second conductive member 22 are in a range from 1.5 µm to 2.5 µm, for example.

In this way, the intermediate body 20 is provided. The intermediate body 20 includes the wiring substrate 10, the first conductive members 21 disposed on and in contact with the metal layer 14 of the wiring substrate 10, and the second conductive members 22 separated from the first conductive member 21 and disposed on and in contact with the metal layer 14. The intermediate body 20 may be manufactured or purchased from an outside source. To manufacture the intermediate body 20, the above-described processes or other processes can be used.

Disposing Resist Layer

Subsequently, a resist layer 30 is disposed on the intermediate body 20 such that at least a portion of the resist layer 30 is located between the first conductive member 21 and the second conductive member 22.

Figure 7:
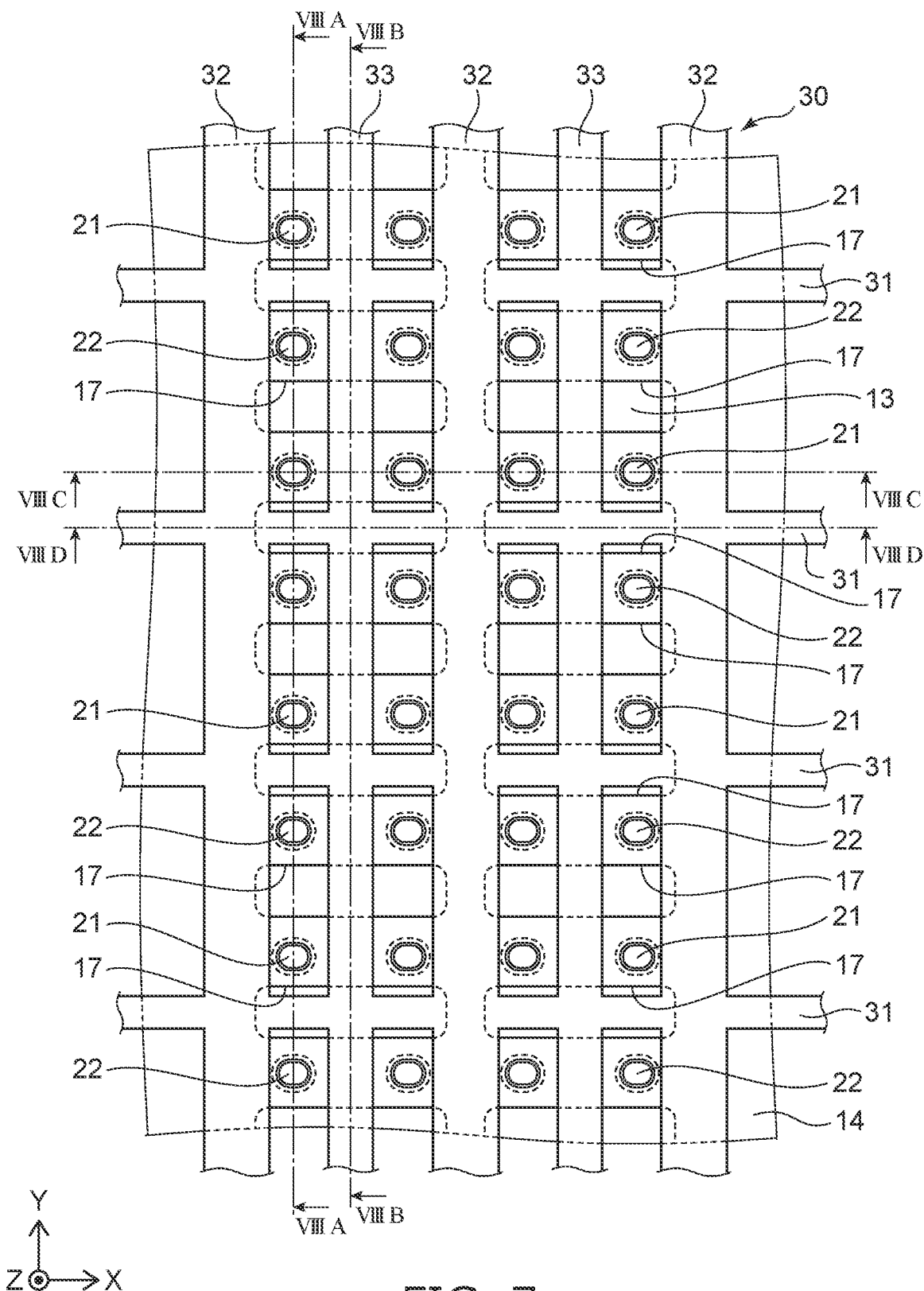
FIG. 7 is a schematic plan view illustrating a method for manufacturing a light emitting module according to the embodiment.

FIG. 7 is a schematic plan view illustrating a method for manufacturing the light emitting module according to the embodiment.

Figure 8A:
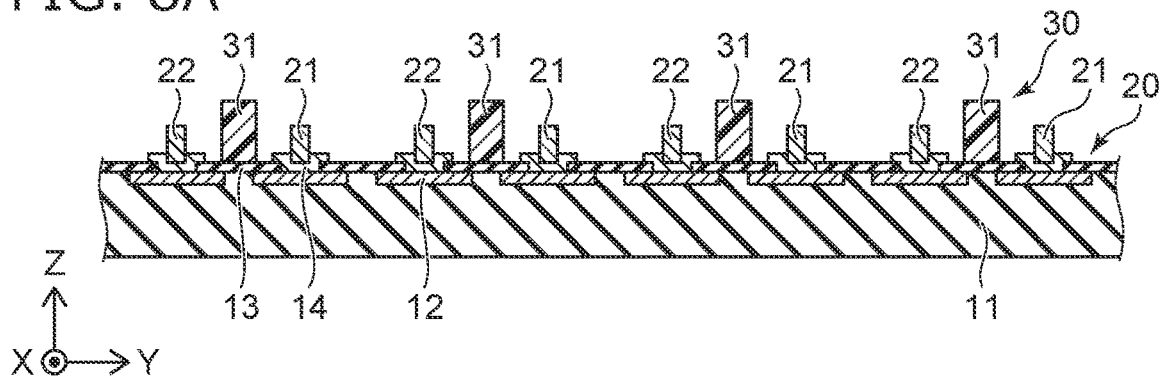
FIG. 8A is a schematic end view taken along line VIIIA-VIIIA illustrated in FIG. 7.

FIG. 8A is a schematic end view taken along line VIIIA-VIIIA illustrated in FIG. 7.

Figure 8B:
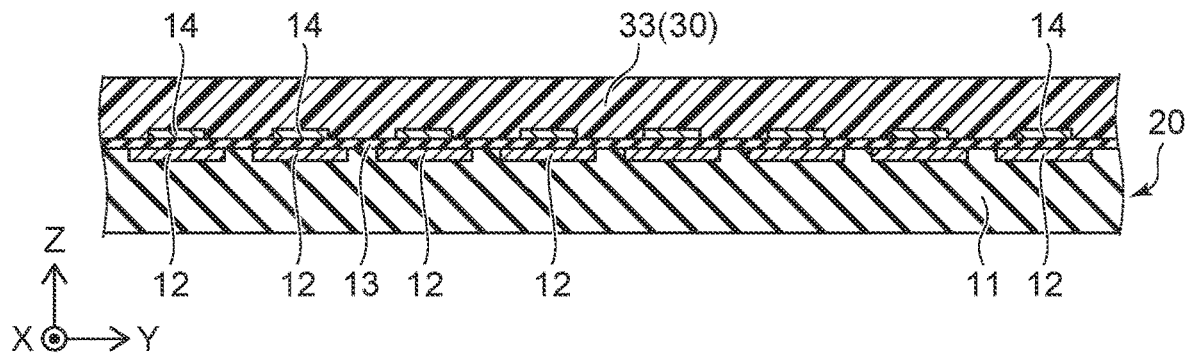
FIG. 8B is a schematic end view taken along line VIIIB-VIIIB illustrated in FIG. 7.

FIG. 8B is a schematic end view taken along line VIIIB-VIIIB illustrated in FIG. 7.

Figure 8C:
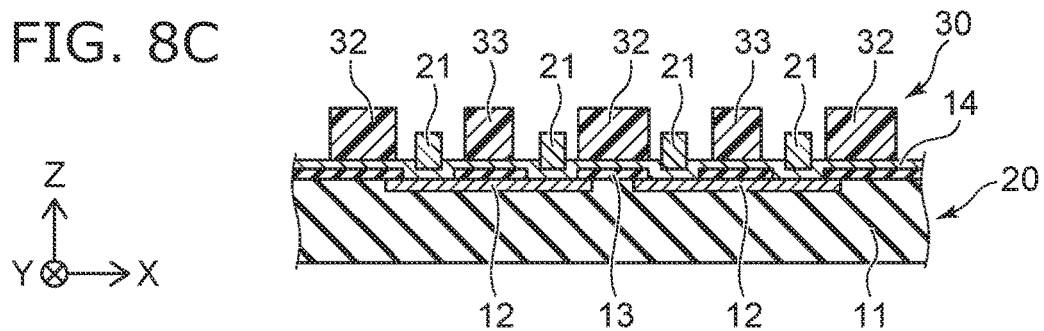
FIG. 8C is a schematic end view taken along line VIIIC-VIIIC illustrated in FIG. 7.

FIG. 8C is a schematic end view taken along line VIIIC-VIIIC illustrated in FIG. 7.

Figure 8D:
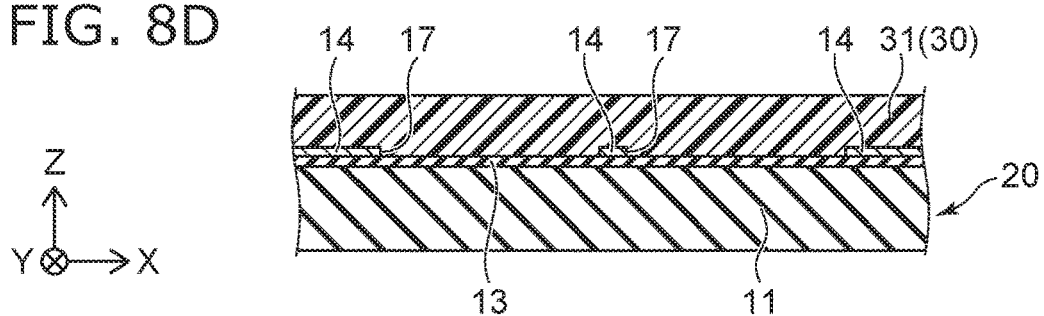
FIG. 8D is a schematic end view taken along line VIIID-VIIID illustrated in FIG. 7.

FIG. 8D is a schematic end view taken along line VIIID-VIIID line illustrated in FIG. 7.

The resist layer 30 is formed by, for example, photolithography. As illustrated in FIGS. 7 to 8D, in a plan view, the resist layer 30 has a lattice shape including first portions 31 extending in the X-direction, second portions 32 extending in the Y-direction, and third portions 33 extending in the Y-direction. The first portions 31 are arranged to pass through areas immediately above every other row of the second openings 17 arrayed in the Y-direction. Thus, the first portions 31 are disposed between the first conductive members 21 and the second conductive members 22 in the Y-direction. The thickness of the resist layer 30 is preferably greater than a distance from the upper surface of the metal layer 14 surrounding the first recessed portions 18 and the second recessed portions 19 to the upper end of the first conductive member 21 and the second conductive member 22. The thickness of the resist layer 30 is preferably 1.4 times to 2.6 times the thickness of the first conductive member 21 and the second conductive member 22. For example, the thickness of the resist layer 30 may be in a range from 3.5 μm to 4.0 μm.

The second portions 32 and the third portions 33 are alternately arrayed along the X-direction. The second portions 32 pass between the adjacent two second openings 17 arranged in the X-direction in a plan view, while overlapping end portions of the adjacent two second openings 17 in the X-direction. The third portions 33 pass through the center portions of the second openings 17 in the X-direction in a plan view.

Thus, the first conductive members 21 and the second conductive members 22 are individually surrounded by the resist layer 30 and the second openings 17 of the metal layer 14 in a plan view. Specifically, each of the first conductive members 21 and the second conductive members 22 is surrounded by the resist layer 30 on three sides, that is, on both sides in the X-direction and one side in the Y-direction. On the remaining side, that is, on the other side in the Y-direction, each of the first conductive members 21 and the second conductive members 22 is not surrounded by the resist layer 30 and the second opening 17 is located.

Disposing Light-Emitting Elements on Resist Layer

Subsequently, light-emitting elements 40 are disposed on the resist layer 30.

Figure 9:
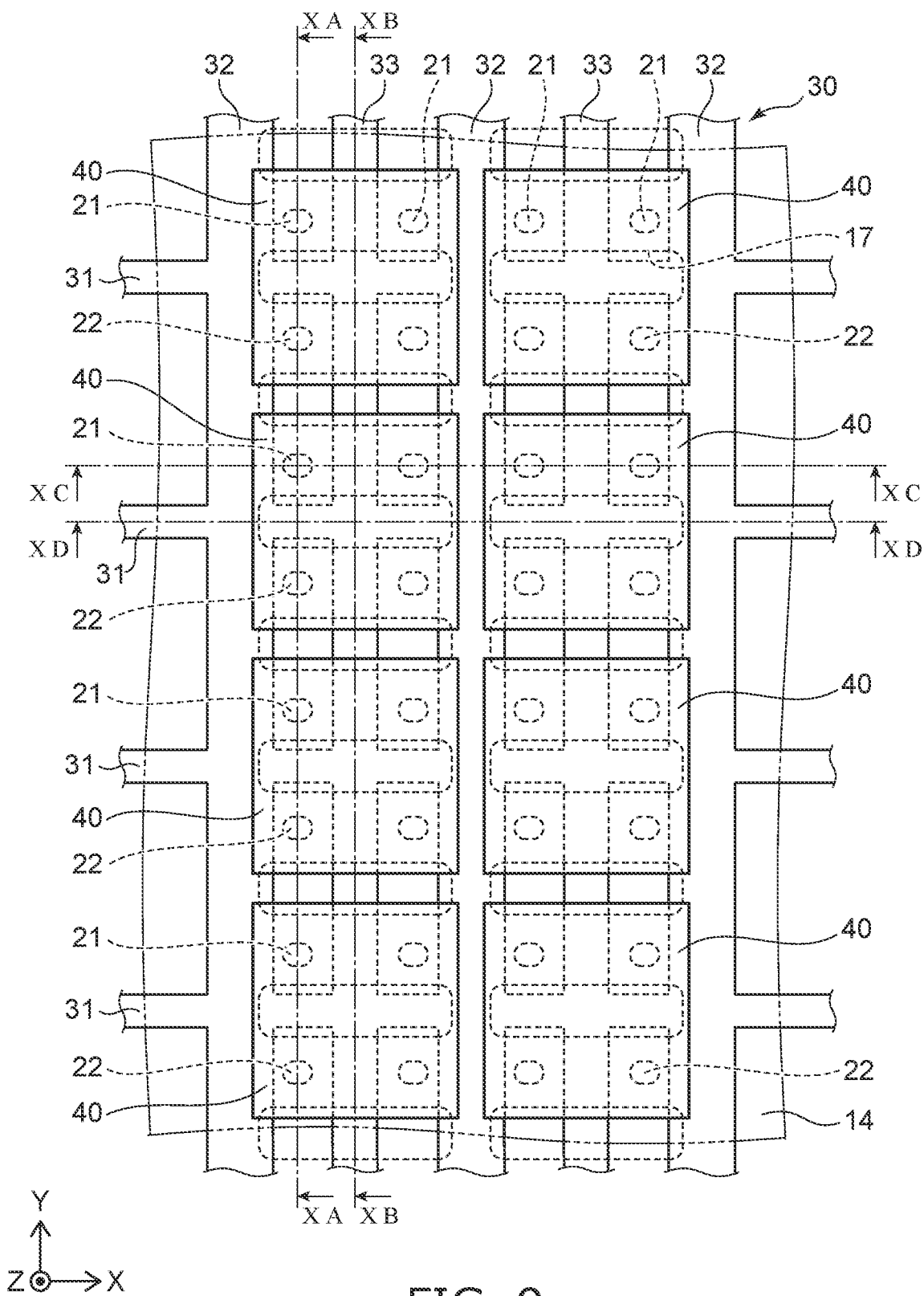
FIG. 9 is a schematic plan view illustrating a method for manufacturing a light emitting module according to the embodiment.

FIG. 9 is a schematic plan view illustrating a method for manufacturing the light emitting module according to the embodiment.

Figure 10A:
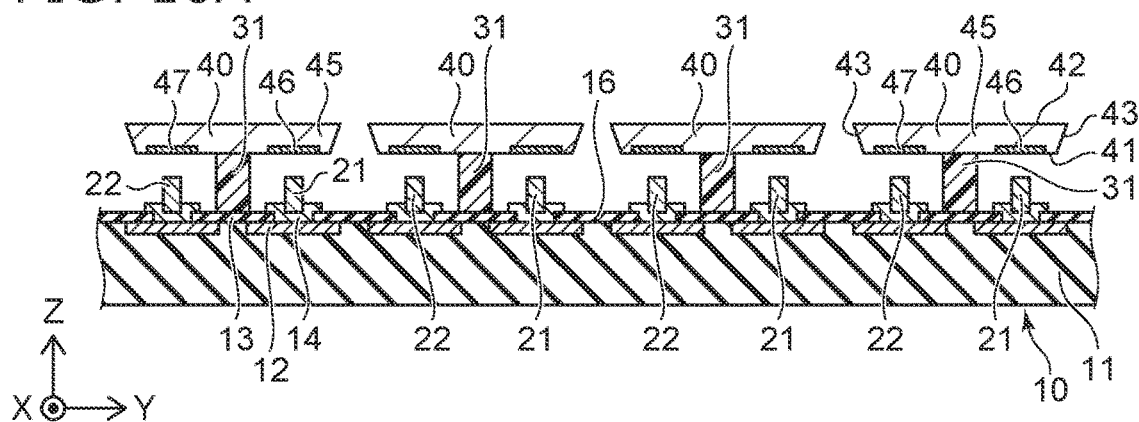
FIG. 10A is a schematic end view taken along line XA-XA illustrated in FIG. 9.

FIG. 10A is a schematic end view taken along line XA-XA illustrated in FIG. 9.

Figure 10B:
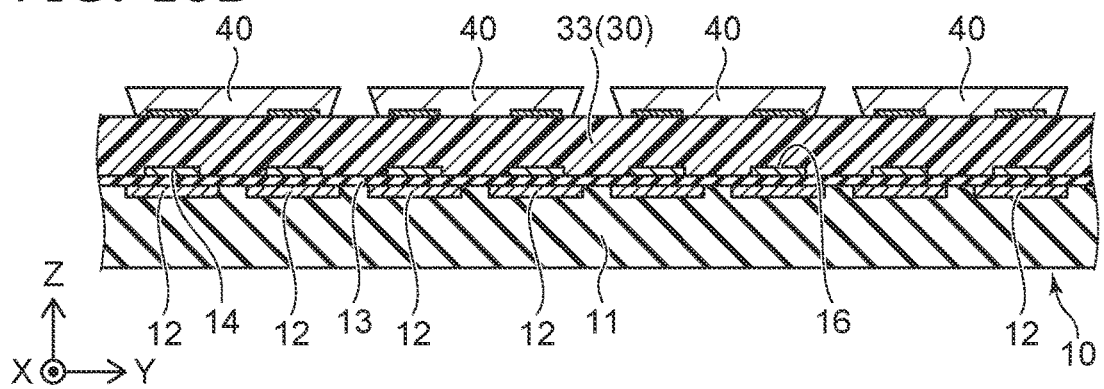
FIG. 10B is a schematic end view taken along line XB-XB illustrated in FIG. 9.

FIG. 10B is a schematic end view taken along line XB-XB illustrated in FIG. 9.

Figure 10C:
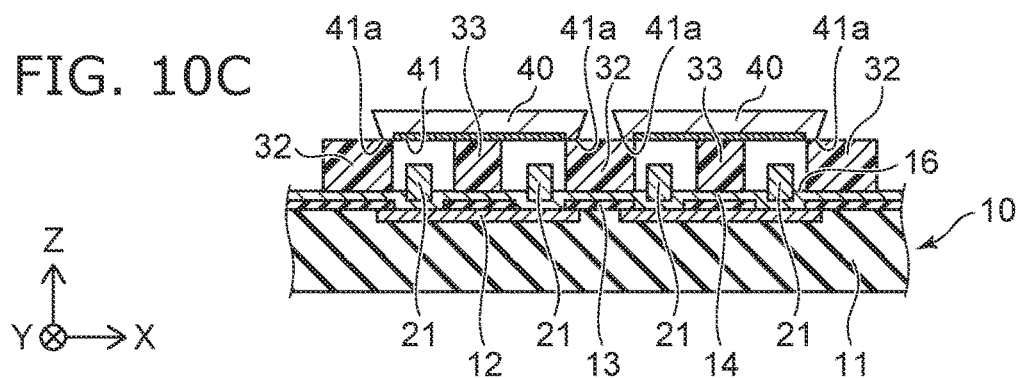
FIG. 10C is a schematic end view taken along line XC-XC illustrated in FIG. 9.

FIG. 10C is a schematic end view taken along line XC-XC illustrated in FIG. 9.

Figure 10D:
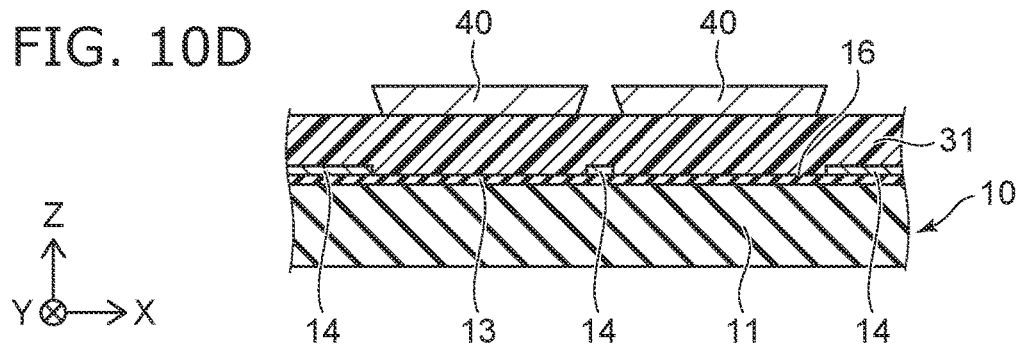
FIG. 10D is a schematic end view taken along line XD-XD illustrated in FIG. 9.

FIG. 10D is a schematic end view taken along line XD-XD illustrated in FIG. 9.

The light-emitting elements 40 are, for example, light emitting diodes (LED). The shape of the light-emitting element 40 is not particularly limited, and may be formed as, for example, a frustum of a square pyramid or a rectangular parallelepiped. In the case of a frustum of a square pyramid or a rectangular parallelepiped, the light-emitting elements 40 each include a lower surface 41, an upper surface 42 opposite the lower surface 41, and four lateral surfaces 43 between the lower surface 41 and the upper surface 42. The lower surface 41 has a rectangular shape. The light-emitting elements 40 each include a semiconductor layered body 45, a first electrode 46, and a second electrode 47. The first electrode 46 and the second electrode 47 are separated from each other on the lower surface 41. Here, the light-emitting element 40 has a shape of a frustum of a square pyramid in which the upper surface 42 is larger than the lower surface 41.

The light-emitting elements 40 are disposed on the resist layer 30. At this time, the lower surface 41 of each of the light-emitting element 40 is made to face the upper surface 16 of the wiring substrate 10. The light-emitting elements 40 are separated from the wiring substrate 10 by the resist layer 30 and face the wiring substrate 10. The light-emitting elements 40 are disposed on the resist layer 30 such that the first electrodes 46 face the first conductive members 21 and the second electrodes 47 face the second conductive members 22.

The light-emitting elements 40 are each disposed at the intersection between the first portions 31 and the third portions 33 of the resist layer 30. This brings the center portion of each of the light-emitting elements 40 in the Y-direction into contact with the first portion 31 of the resist layer 30. The center portion of each of the light-emitting elements 40 in the X-direction is brought into contact with the third portion 33 of the resist layer 30. That is, the light-emitting elements 40 are supported by at least the first portions 31 and the third portions 33 of the resist layer 30. In this way, the light-emitting elements 40 are preferably disposed on the resist layer 30 such that the center portions of the lower surfaces 41 are located on the areas of intersection between the first portions 31 and the third portions 33 of the resist layer 30. This makes it possible to hold the light-emitting elements 40 stably.

It is preferable that both end portions of each of the light-emitting element 40 in the X-direction, that is, two opposite sides 41a of the outer edge of the lower surface 41 of each of the light-emitting elements 40 are in contact with the second portion 32 of the resist layer 30. The second portion 32 of the resist layer 30 can also support the both end portions of each of the light-emitting element 40 in the X-direction, and thus holding the light-emitting elements 40 more stably.

Forming First Bonding Member and Second Bonding Member

Subsequently, first bonding members 51 and second bonding members 52 are formed on the metal layer 14.

Figure 11:
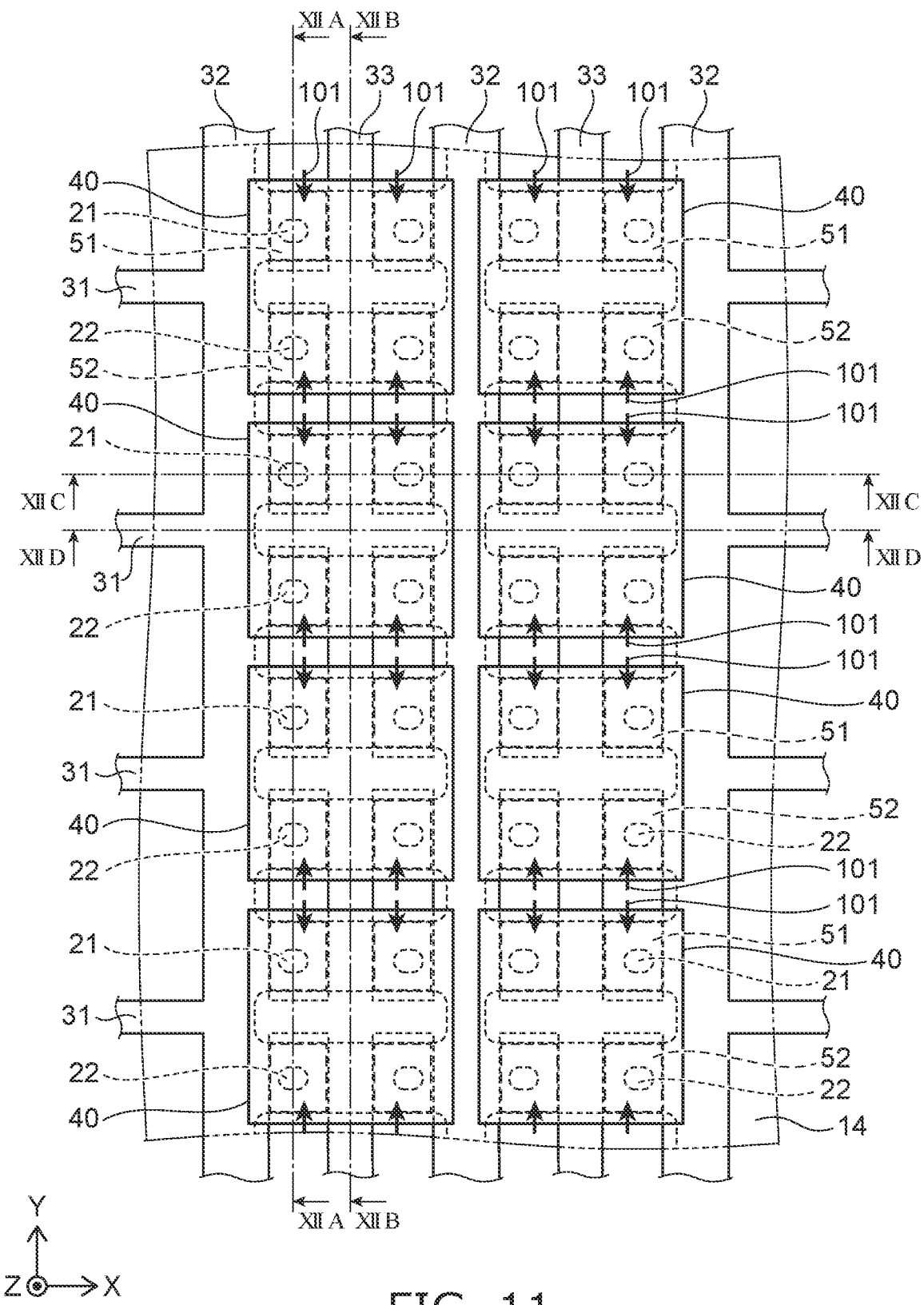
FIG. 11 is a schematic plan view illustrating a method for manufacturing a light emitting module according to the embodiment.

FIG. 11 is a schematic plan view illustrating a method for manufacturing the light emitting module according to the present embodiment.

Figure 12A:
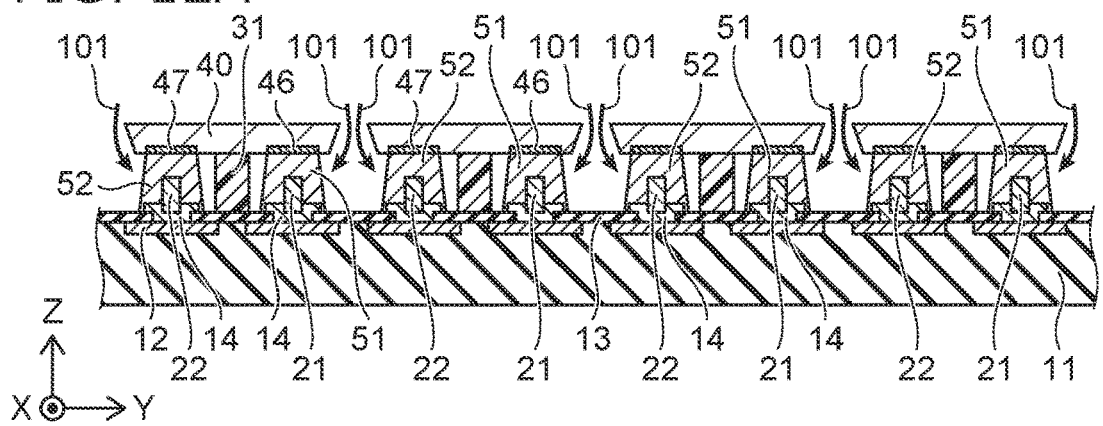
FIG. 12A is a schematic end view taken along line XIIA-XIIA illustrated in FIG. 11.

FIG. 12A is a schematic end view taken along line XIIA-XIIA illustrated in FIG. 11.

Figure 12B:
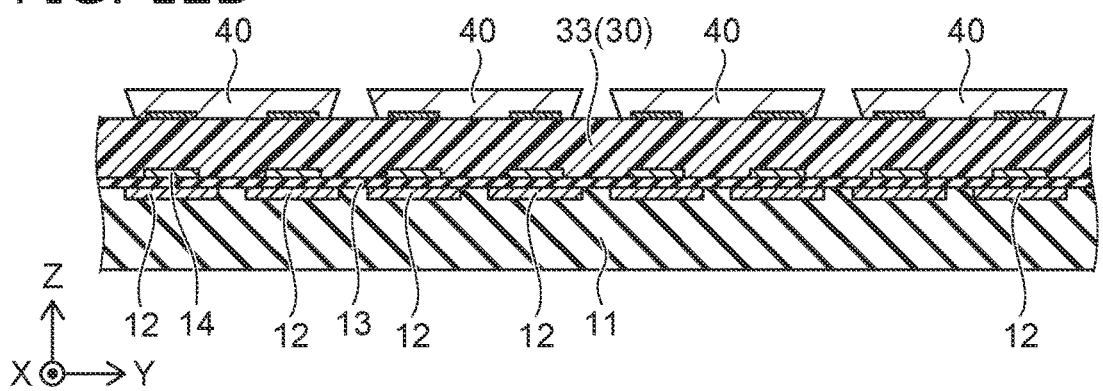
FIG. 12B is a schematic end view taken along line XIIB-XIIB illustrated in FIG. 11.

FIG. 12B is a schematic end view taken along line XIIB-XIIB illustrated in FIG. 11.

Figure 12C:
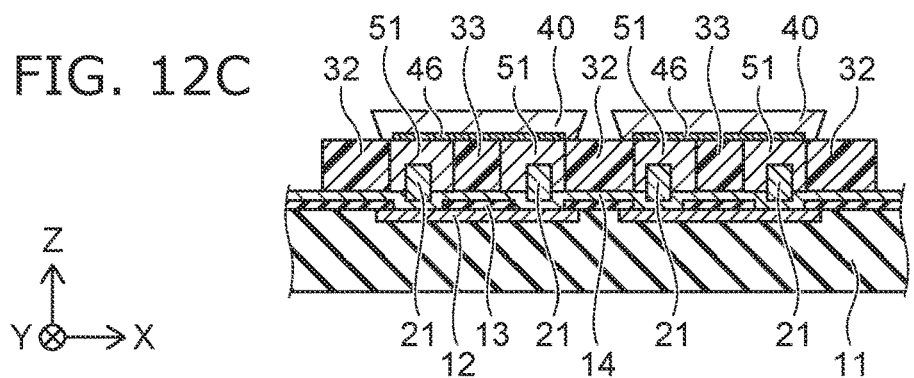
FIG. 12C is a schematic end view taken along line XIIC-XIIC illustrated in FIG. 11.

FIG. 12C is a schematic end view taken along line XIIC-XIIC line illustrated in FIG. 11.

Figure 12D:
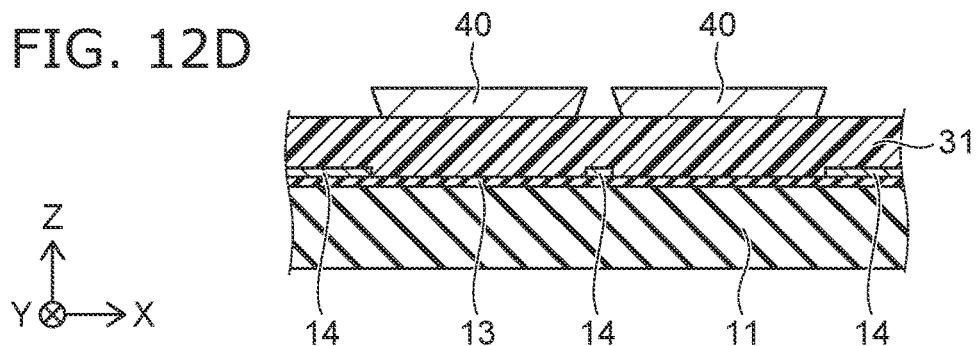
FIG. 12D is a schematic end view taken along line XIID-XIID illustrated in FIG. 11.

FIG. 12D is a schematic end view taken along line XIID-XIID illustrated in FIG. 11.

As illustrated in FIGS. 11 to 12D, the first bonding members 51 and the second bonding members 52 are formed on the metal layer 14. The first bonding members 51 and the second bonding members 52 can be formed of a material such as tungsten (W), copper (Cu), nickel (Ni), silver (Ag), gold (Au), palladium (Pd), or platinum (Pt), or an alloy containing one of these materials. In particular, it is preferable to use copper in terms of heat dissipation as in the first conductive members 21 and the second conductive members 22. The first bonding members 51 and the second bonding members 52 can be formed by electrolytic plating using, for example, a plating solution of copper. When forming the first bonding members 51 and the second bonding members 52 by electrolytic plating, the metal layer 14, the first conductive members 21, and the second conductive members 22 become seed layers for plating.

Specifically, the intermediate body including the resist layer 30 and the light-emitting elements 40 is immersed in a plating bath containing a plating solution 101. Thus, the plating solution 101 is supplied to the metal layer 14 from above the light-emitting elements 40. The plating solution 101 mainly flows around and under each of the light-emitting elements 40 through a gap between adjacent two light-emitting elements 40 arranged in the Y-direction at a portion where the first portion 31 of the resist layer 30 is not provided, and flows toward both sides in the Y-direction. Subsequently, the plating solution 101 comes into contact with the metal layer 14, the first conductive members 21, and the second conductive members 22. This allows the plating layer to grow from the surface of the metal layer 14, the surface of the first conductive member 21, and the surface of the second conductive member 22.

As a result, first bonding members 51 are formed to cover the first conductive members 21 and the vicinity of the portions that contact the first conductive members 21 in the metal layer 14. Second bonding members 52 are formed to cover the second conductive members 22 and the vicinity of the portions that contact the second conductive members 22 in the metal layer 14.

The first bonding member 51 reaches and contacts the first electrodes 46 of the light-emitting elements 40. The second bonding member 52 reaches and contacts the second electrodes 47 of the light-emitting elements 40. In this manner, the first bonding members 51 contacting the first conductive members 21 and the first electrodes 46 are formed on the metal layer 14, while the second bonding members 52 are formed separated from the first conductive members 21 and in contact with the second conductive members 22 and the second electrodes 47.

This process enables efficient and faster formation of the first bonding members 51 by growing them from the first conductive members 21. Likewise, the efficient and faster formation of the second bonding members 52 can be achieved by growing them from the second conductive members 22.

In particular, the upper end of the first conductive member 21 and the upper end of the second conductive member 22 are located above the upper surface of the metal layer 14, so that the first bonding member 51 formed on the upper end of the first conductive member 21 and the second bonding member 52 formed on the upper end of the second conductive member 22 can more quickly reach the first electrode 46 and the second electrode 47, respectively. In other words, the intermediate body including the first conductive members 21 and the second conductive members 22 can suppress formation of the recessed portions reflecting the shape of the first recessed portions 18 and the second recessed portions 19 in the first bonding members 51 and the second bonding members 52. In a case in which the first bonding members 51 and the second bonding members 52 reach the first electrodes 46 and the second electrodes 47, respectively, by reflecting the concave shape on their surfaces, cavities may result from the recessed shape and formed at the interface between the first bonding member 51 and the first electrode 46, and between the second bonding member 52 and the second electrode 47, causing a decrease of bonding strength, an electrical characteristic, and a heat dissipation characteristic.

Furthermore, it is easy to control the shape of the first bonding members 51 and the second bonding members 52, as they are formed in the space surrounded on three sides by the resist layer 30 between the lower surface of the light-emitting element 40 and the wiring substrate 10. In particular, the first bonding member 51 and second bonding members 52 can be suppressed from being in contact with each other, as the first portion 31 of the resist layer 30 is located between the first bonding member 51 connected to the first electrode 46 and the second bonding member 52 connected to the second electrode 47 in one light-emitting element 40.

Removing Resist Layer

Figure 13:
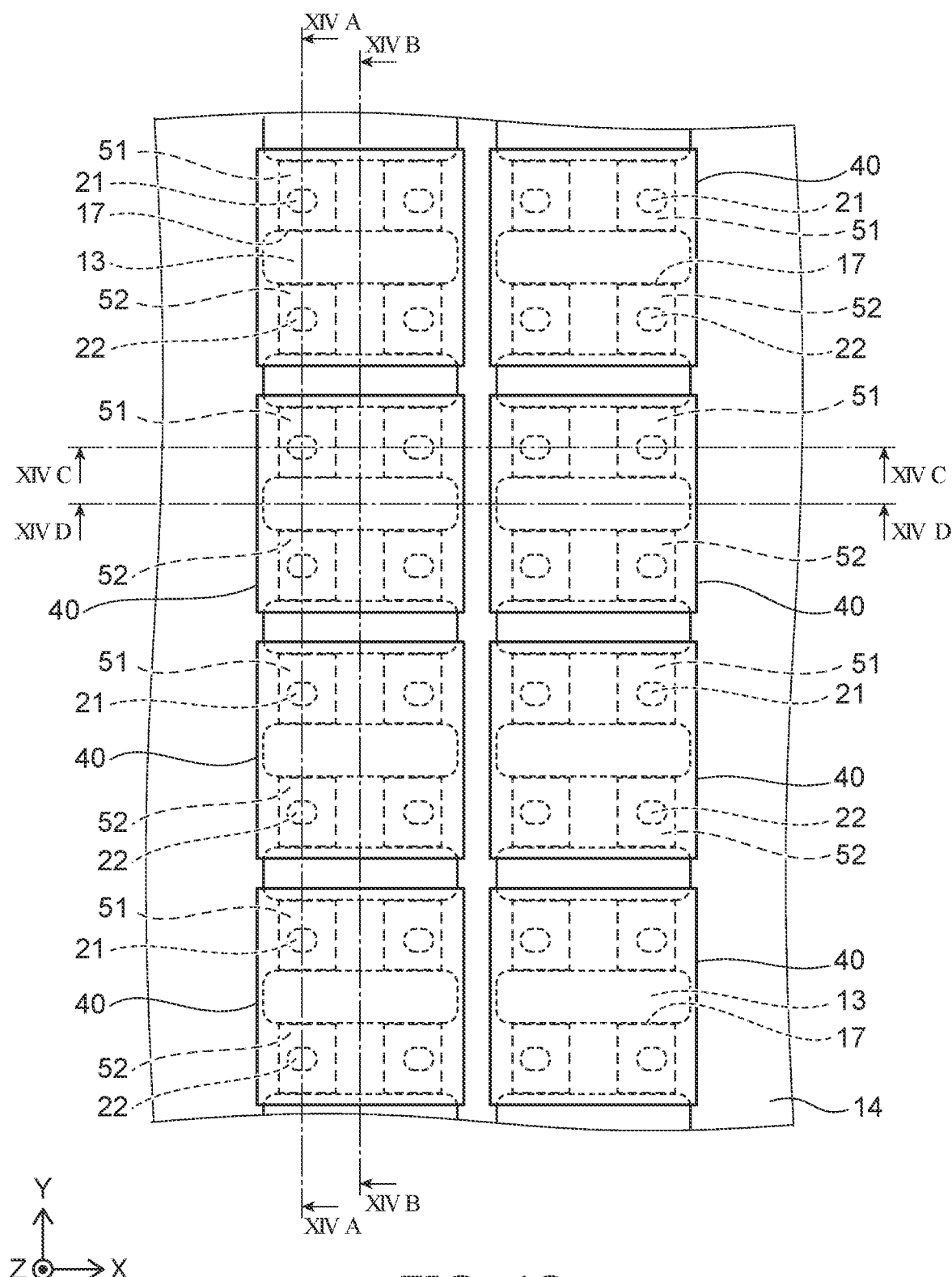
FIG. 13 is a schematic plan view illustrating a method for manufacturing a light emitting module according to the embodiment.

FIG. 13 is a schematic plan view illustrating a method for manufacturing the light emitting module according to the present embodiment.

Figure 14A:
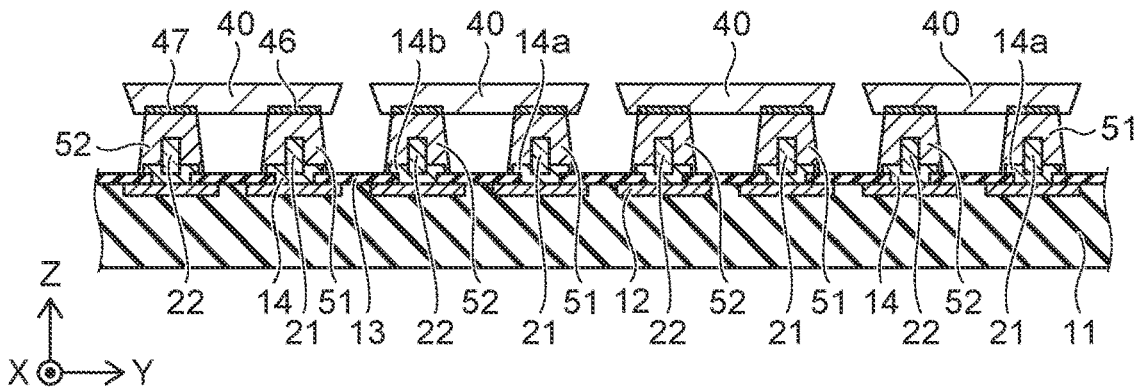
FIG. 14A is a schematic end view taken along line XIVA-XIVA illustrated in FIG. 13.

FIG. 14A is a schematic end view taken along line XIVA-XIVA illustrated in FIG. 13.

Figure 14B:
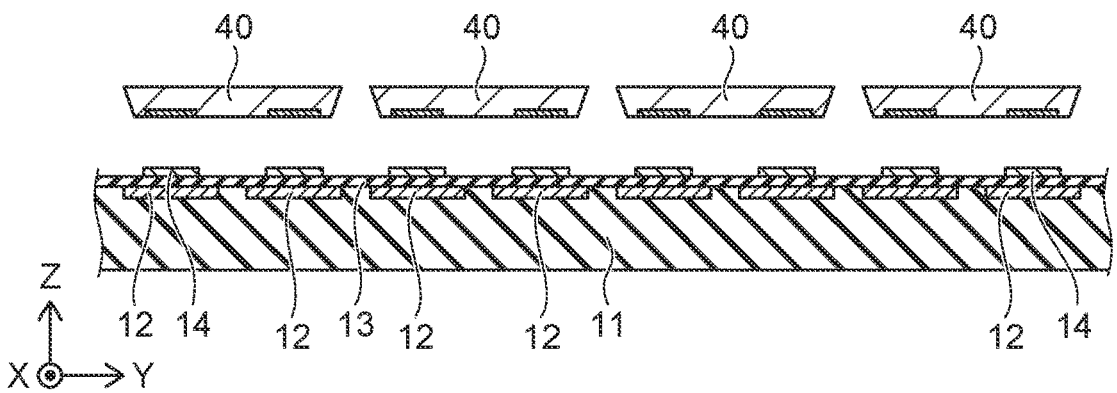
FIG. 14B is a schematic end view taken along line XIVB-XIVB illustrated in FIG. 13.

FIG. 14B is a schematic end view taken along line XIVB-XIVB illustrated in FIG. 13.

Figure 14C:
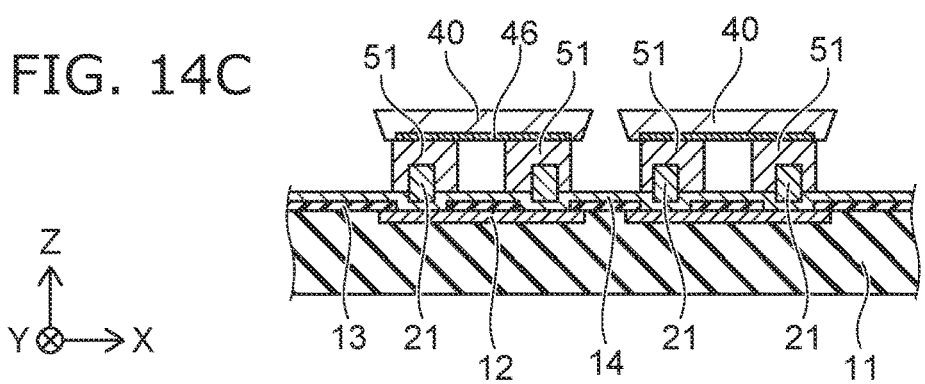
FIG. 14C is a schematic end view taken along line XIVC-XIVC illustrated in FIG. 13.

FIG. 14C is a schematic end view taken along line XIVC-XIVC illustrated in FIG. 13.

Figure 14D:
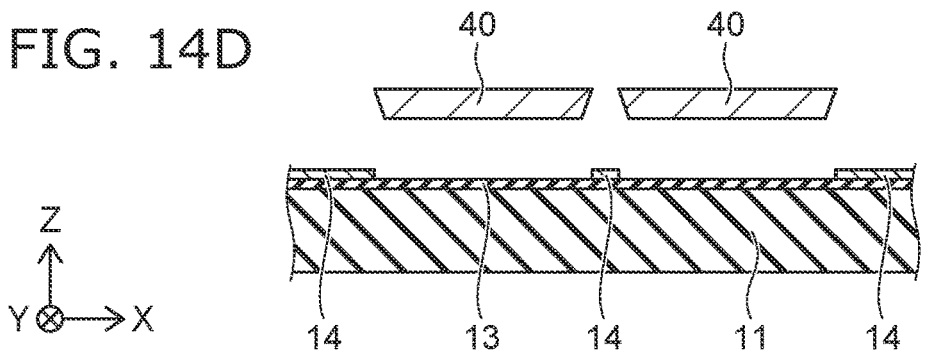
FIG. 14D is a schematic end view taken along line XIVD-XIVD line illustrated in FIG. 13.

FIG. 14D is a schematic end view taken along line XIVD-XIVD illustrated in FIG. 13.

Subsequently, the resist layer 30 is removed, as illustrated in FIGS. 13 to 14D. For example, the resist layer 30 is removed by immersing, in a stripper solution, the wiring substrate 10 on which the first conductive members 21 and the second conductive members 22 are formed. This exposes the portions of the insulating film 13 and the metal layer 14 that have been covered with the resist layer 30.

Separating Metal Layer

Figure 15:
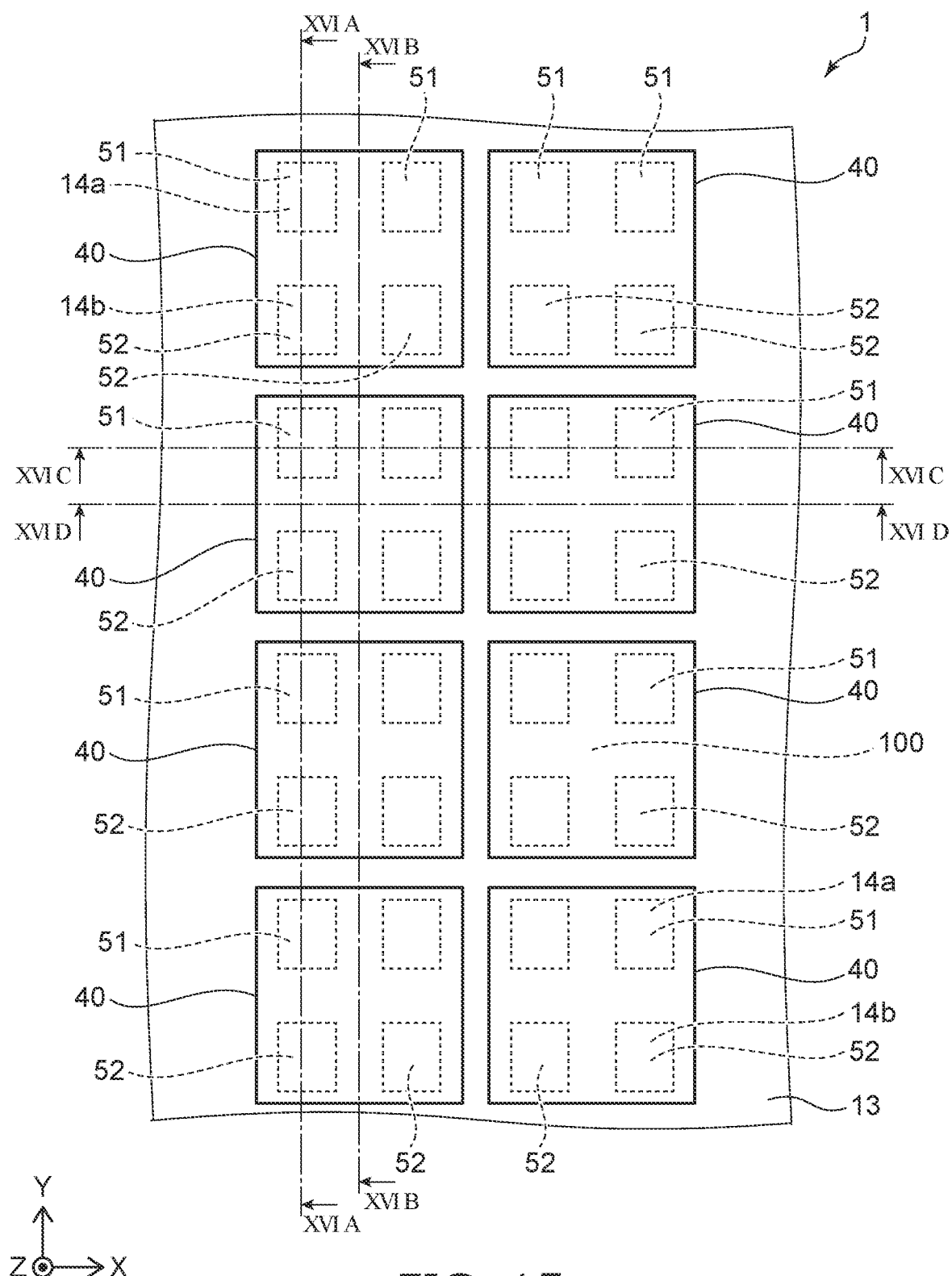
FIG. 15 is a schematic plan view illustrating a method for manufacturing a light emitting module according to the embodiment.

FIG. 15 is a schematic plan view illustrating a method for manufacturing the light emitting module according to the present embodiment.

Figure 16A:
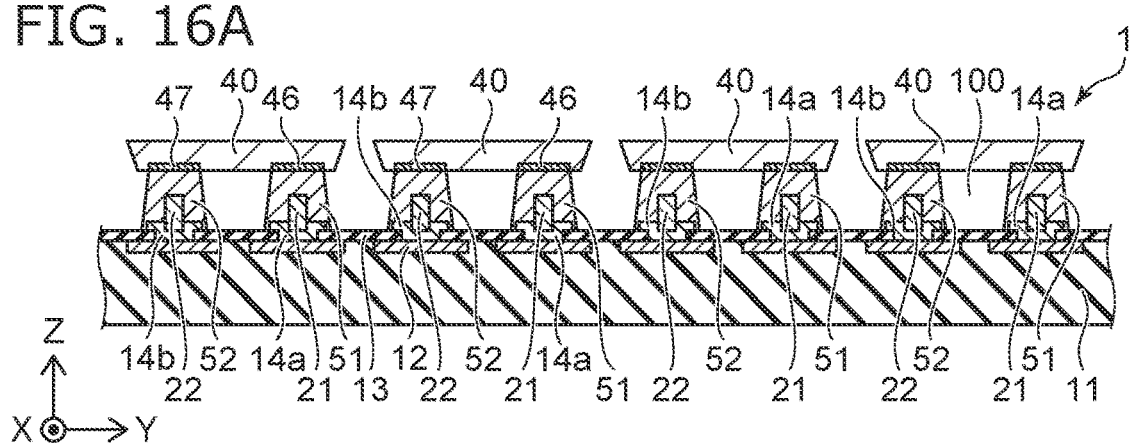
FIG. 16A is a schematic end view taken along line XVIA-XVIA illustrated in FIG. 15.

FIG. 16A is a schematic end view taken along line XVIA-XVIA illustrated in FIG. 15.

Figure 16B:
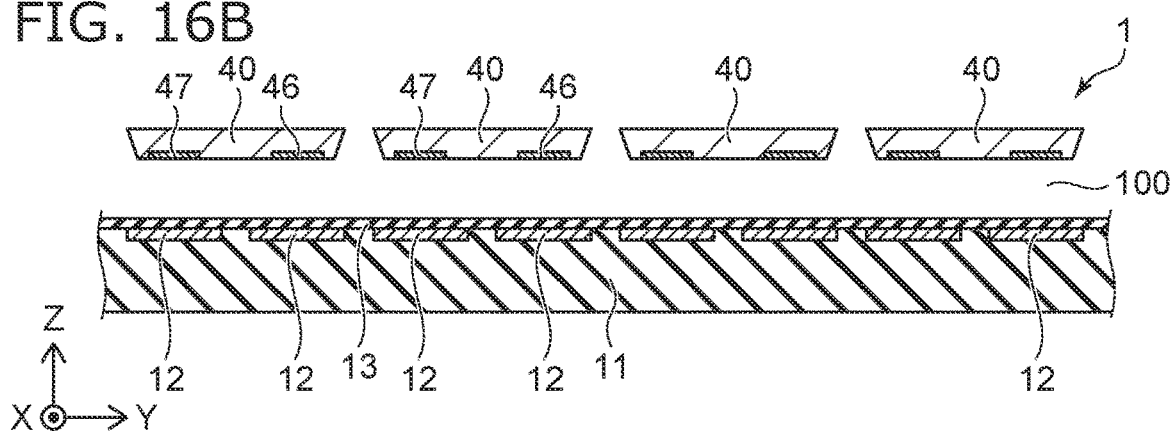
FIG. 16B is a schematic end view taken along line XVIB-XVIB illustrated in FIG. 15.

FIG. 16B is a schematic end view taken along line XVIB-XVIB illustrated in FIG. 15.

Figure 16C:
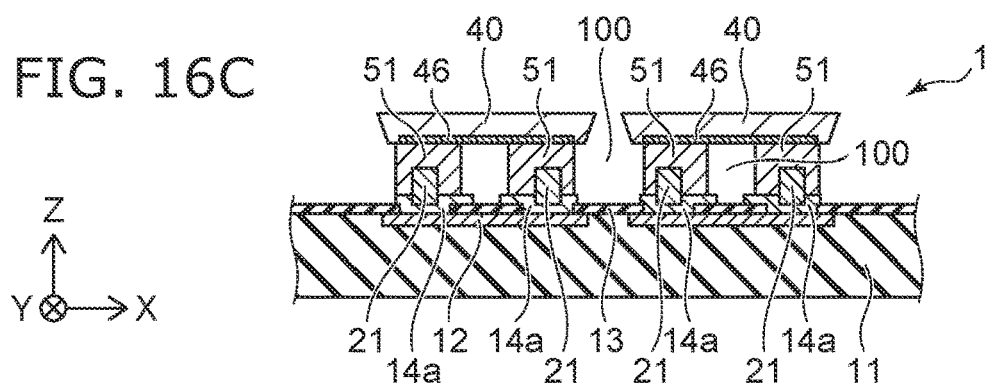
FIG. 16C is a schematic end view taken along line XVIC-XVIC illustrated in FIG. 15.

FIG. 16C is a schematic end view taken along line XVIC-XVIC illustrated in FIG. 15.

Figure 16D:
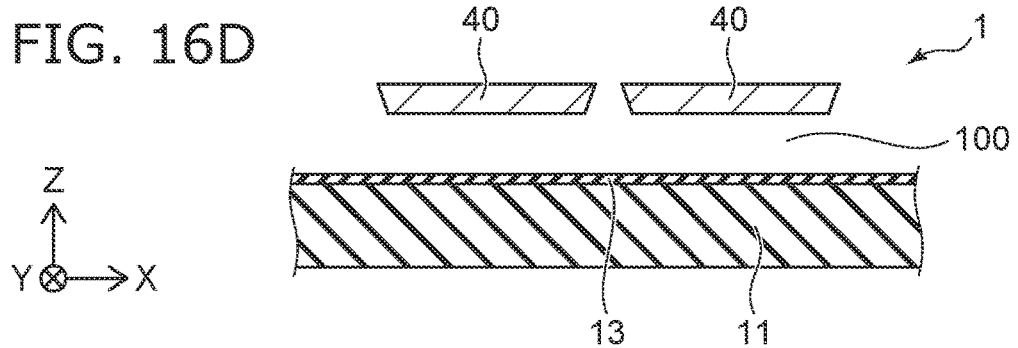
FIG. 16D is a schematic end view taken along line XVID-XVID illustrated in FIG. 15.

FIG. 16D is a schematic end view taken along line XVID-XVID illustrated in FIG. 15.

Subsequently, as illustrated in FIGS. 15 to 16D, the metal layer 14 is etched using the first bonding members 51 and the second bonding members 52 as masks. For example, the etching is carried out by wet etching. This selectively removes the metal layer 14. That is, portions of the metal layer 14 covered with the first bonding members 51 and the second bonding members 52 are remained, and portions not covered therewith are removed. In this case, although the first bonding member 51 and the second bonding member 52 are also etched partially, the metal layer 14 exposed from the first bonding member 51 and the second bonding member 52 can be selectively removed, as the film thickness of the metal layer 14 is sufficiently small compared to the width of the first bonding member 51 and the second bonding member 52 in the X-direction and the Y-direction.

As a result, the metal layer 14 is separated into a first metal layer 14a that is in contact with the first conductive member 21 and the first bonding member 51, and a second metal layer 14b that is in contact with the second conductive member 22 and the second bonding member 52. The first metal layer 14a is separated from the second metal layer 14b, as the portion of the metal layer 14 located between the first metal layer 14a and the second metal layer 14b is removed by etching. Thus, the metal member composed of the first metal layer 14a, the first conductive member 21, and the first bonding member 51 is separated from the metal member composed of the second metal layer 14b, the second conductive member 22, and the second bonding member 52. In this manner, the light emitting module 1 according to the present embodiment is manufactured.

Forming Metal Film

Subsequent to separating the metal layer, the method for manufacturing the light emitting module according to the present embodiment may further include covering the surface of the first bonding members 51 and the second bonding members 52 with a metal film 60 by non-electrolytic plating. Such plating processing can provide coating to suppress exposure of the material (such as Cu) composing the first bonding members 51 and the second bonding members 52 to the outside. The metal film 60 formed in this manner preferably use gold (Au) for its outermost surface. Specifically, the metal film 60 may be a single-layered film of Au or a multi-layered film formed of at least one of Ni, Ag, Pd, and Pt.

Light Emitting Module

Next, the configuration of the light emitting module 1 manufactured as described above will be described.

Figure 17:
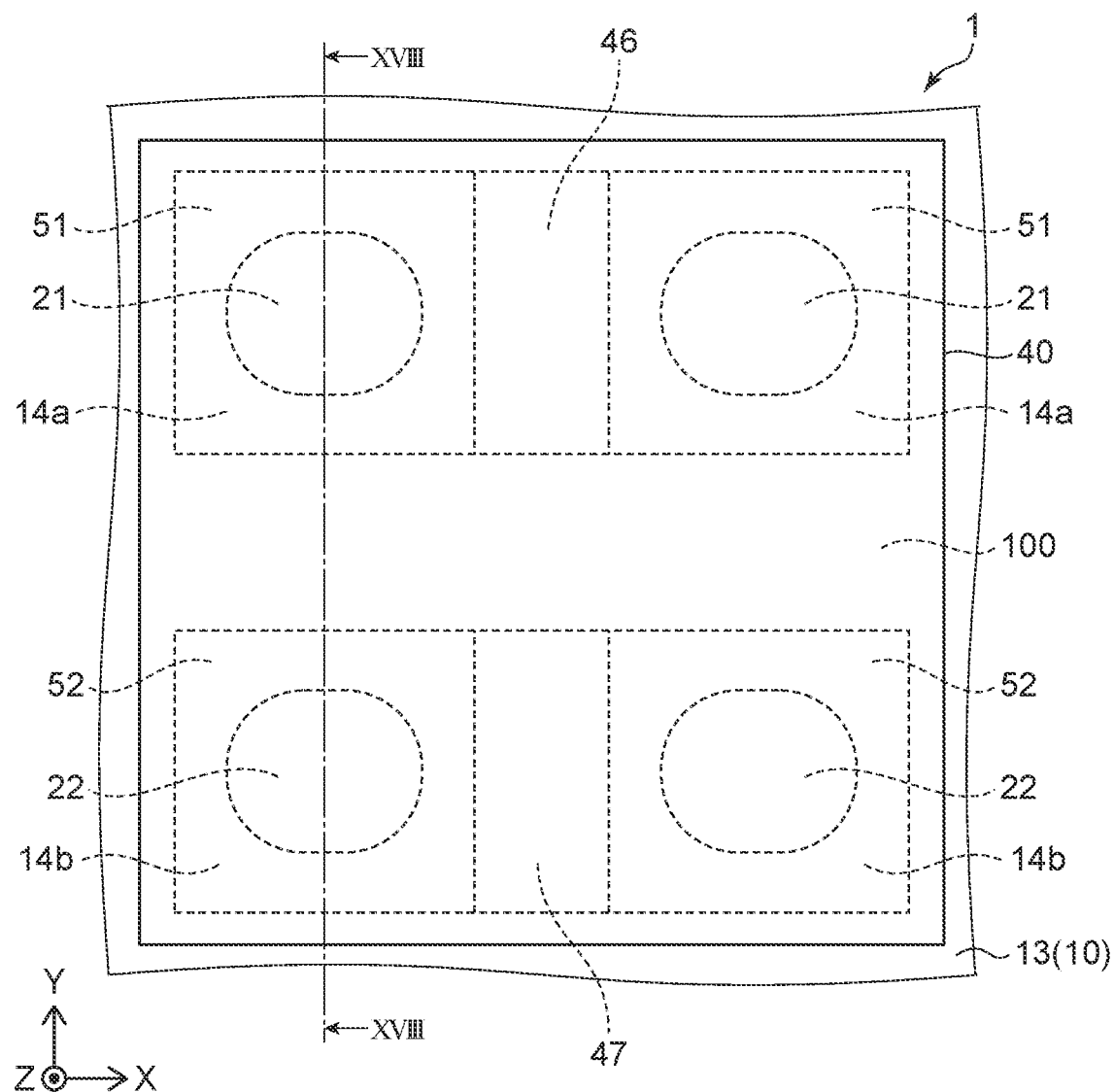
FIG. 17 is a schematic plan view illustrating a light emitting module according to the embodiment.

FIG. 17 is a schematic plan view illustrating a light emitting module according to the present embodiment.

Figure 18:
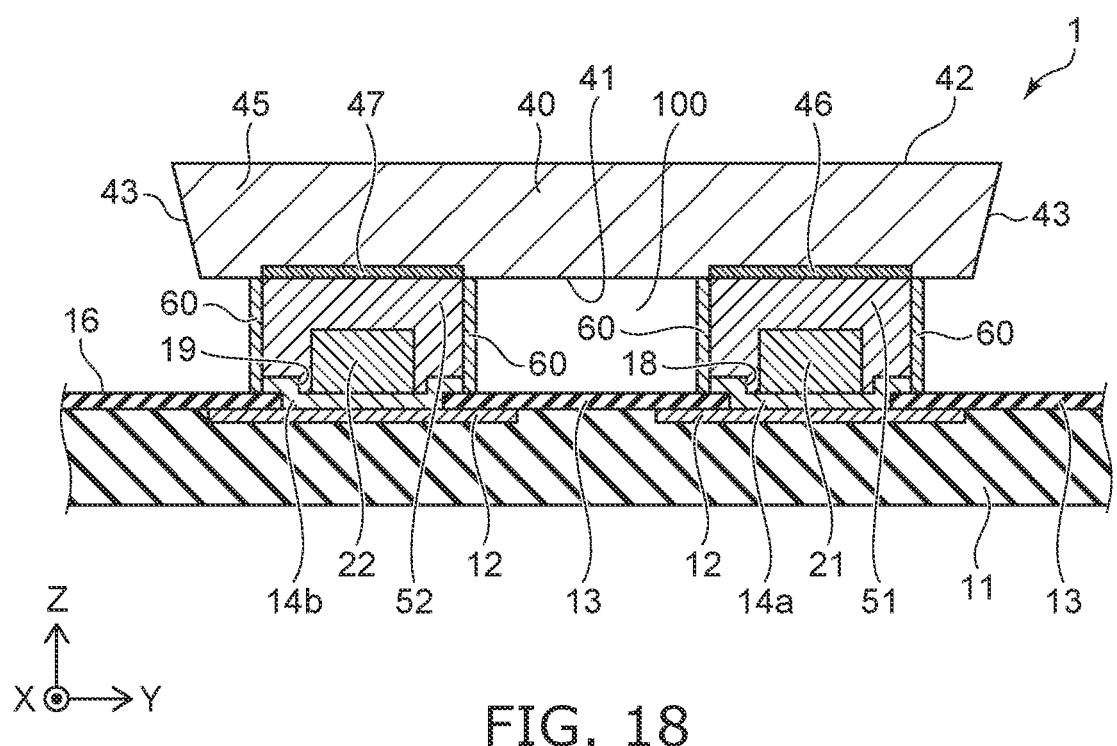
FIG. 18 is a schematic end view taken along line XVIII-XVIII illustrated in FIG. 17.

FIG. 18 is a schematic end view taken along line XVIII-XVIII illustrated in FIG. 17.

As illustrated in FIGS. 17 and 18, the light emitting module 1 according to the present embodiment includes the wiring substrate 10, the first conductive member 21, the second conductive member 22, the first bonding member 51, the second bonding member 52, and the light-emitting element 40. The wiring substrate 10 and the light-emitting element 40 are separated from each other in the Z-direction, and the first bonding member 51 and the second bonding member 52 are disposed between the wiring substrate 10 and the light-emitting element 40. Between the wiring substrate 10 and the light-emitting element 40, a space 100 is provided between the first bonding members 51, between the second bonding members 52, and between the first and second bonding members 51 and 52. In the space 100, for example, atmosphere, exists.

The wiring substrate 10 includes the substrate 11, the wirings 12, the insulating film 13, the first metal layer 14a, and the second metal layer 14b. The wiring substrate 10 is, for example, an ASIC substrate. The substrate 11 is a semiconductor substrate containing, for example, silicon (Si) or the like in which multi-layered wirings 12 are formed. The insulating film 13 is disposed on the substrate 11. The insulating film 13 has the first openings 15 exposing the wirings 12 at the bottom of the first openings 15. The first metal layer 14a and the second metal layer 14b are separated from each other on the upper surface 16 of the wiring substrate 10. Major portions of the first metal layer 14a and the second metal layer 14b are located in the first openings 15 of the insulating film 13, while the peripheral portions thereof are located on the insulating film 13.

This allows the first metal layer 14a and the second metal layer 14b to be connected to the wirings 12 each exposed from the insulating film 13 in the first opening 15. The first metal layer 14a has the first recessed portion 18 corresponding to the first opening 15, and the second metal layer 14b has the second recessed portion 19 corresponding to the first opening 15.

The first conductive member 21 is disposed on and in contact with the first metal layer 14a. The second conductive member 22 is disposed on and in contact with the second metal layer 14b. In a plan view, the first conductive member 21 is encompassed in the first recessed portion 18, and the second conductive member 22 is encompassed in the second recess 19. Preferably, the thickness of the first conductive member 21 is greater than the depth of the first recessed portion 18, and the thickness of the second conductive member 22 is greater than the depth of the second recessed portion 19.

The first bonding member 51 is provided on the first metal layer 14a to cover the first conductive member 21 and contacts the first metal layer 14a and the first conductive member 21. The second bonding member 52 is disposed on the second metal layer 14b to cover the second conductive member 22 and contacts the second metal layer 14b and the second conductive member 22. In other words, the lower surface of the first conductive member 21 is in contact with the first metal layer 14a, and the lateral and upper surfaces of the first conductive member 21 are covered with the first bonding member 51. The first conductive member 21 is not exposed from the first bonding member 51 and the first metal layer 14a. Likewise, the lower surface of the second conductive member 22 is in contact with the second metal layer 14b, and the lateral and upper surfaces of the second conductive member 22 are covered with the second bonding member 52. The second conductive member 22 is not exposed from the second bonding member 52 and the second metal layer 14b. The first metal layer 14a is disposed only in the area immediately below the first bonding member 51, and the second metal layer 14b is disposed only in the area immediately below the second bonding member 52.

The light-emitting element 40 is, for example, a light emitting diode having a shape of a frustum of a square pyramid or a rectangular parallelepiped. The light-emitting element 40 has the lower surface 41, the upper surface 42, and four lateral surfaces 43 arranged between the lower surface 41 and the upper surface 42. The light-emitting elements 40 each include a semiconductor layered body 45, a first electrode 46, and a second electrode 47. The first electrode 46 and the second electrode 47 are separated from each other on the lower surface 41. The lower surface 41 of the light-emitting element 40 faces the upper surface 16 of the wiring substrate 10. In the light-emitting element 40, the first electrode 46 is in contact with the first bonding member 51, and the second electrode 47 is in contact with the second bonding member 52.

The light emitting module 1 according to the present embodiment includes the plurality of light-emitting elements 40 disposed on one wiring substrate 10. The plurality of light-emitting elements 40 are arrayed in a matrix shape along the X-direction and the Y-direction. A gap is made between adjacent light-emitting elements 40 arranged in the X-direction and the Y-direction. In each light-emitting element 40, two first bonding members 51 are connected to the first electrode 46, and two second bonding members 52 are connected to the second electrode 47. The two first bonding members 51 connected to one light-emitting element 40 are arrayed in the X-direction, and two second bonding members 52 connected to one light-emitting element 40 are also arrayed in the X-direction, while the first bonding member 51 and the second bonding member 52 connected to one light-emitting element 40 are arrayed in the Y-direction.

Effects

Next, effects of the present embodiment will be described.

In the present embodiment, the resist layer 30 is formed in a lattice shape in the process illustrated in FIGS. 7 to 8D, and the light-emitting elements 40 are disposed on the resist layer 30 in the process illustrated in FIGS. 9 to 10D. This can equalize the distance between the wiring substrate 10 and the light-emitting elements 40, and facilitate positioning of the light-emitting elements 40.

In the processes illustrated in FIGS. 11 to 12D, the first bonding members 51 and the second bonding members 52 are formed while the light-emitting elements 40 are located on the resist layer 30. The first bonding members 51 and the second bonding members 52 can be grown from the first conductive members 21 and the second conductive members 22, respectively, and therefore, this makes it possible to efficiently form the plurality of first bonding members 51 and the second bonding members 52 that bond the plurality of light-emitting elements 40 to the wiring substrate 10.

At this time, the light-emitting elements 40 can be held reliably by supporting the center portions of the light-emitting elements 40 in the Y-direction by the first portions 31 of the resist layer 30 and supporting the center portions of the light-emitting elements 40 in the X-direction by the third portions 33 of the resist layer 30. The light-emitting elements 40 can be held more reliably by supporting both ends of the light-emitting elements 40 in the X-direction by the second portions 32 of the resist layer 30. On the other hand, the resist layer 30 is not provided under both ends of the light-emitting elements 40 in the Y-direction, thus allowing the plating solution 101 to reach the first conductive members 21 and the second conductive members 22.

Furthermore, it is easy to control the shape of the first bonding members 51 and the second bonding members 52 in the X-direction and the Y-direction, as the first bonding members 51 and the second bonding members 52 are each formed in the space surrounded on three sides by the resist layer 30.

Furthermore, short-circuiting of the first bonding member 51 and the second bonding member 52 can be suppressed, as the first portion 31 of the resist layer 30 is disposed between the first bonding member 51 connected to the first electrode 46 and the second bonding member 52 connected to the second electrode 47 in one light-emitting element 40.

Thus, the light emitting module 1 can be manufactured with high productivity according to the present embodiment. The manufactured light emitting module 1 can suppress variations in the shape of individual components, so that cavities are not generated easily especially in the bonding portions between the first and second bonding members 51 and 52 and the light-emitting element 40. Thus, the light emitting module 1 with higher reliability can be obtained.

The positional relationship between the wiring substrate 10 and the light-emitting elements 40 is not limited to the embodiment described above. For example, the array form of the light-emitting elements 40 is not limited to the matrix shape, and may be in a staggered shape or a hexagonal close-packed shape. The first electrode 46 in the light-emitting element 40 may be connected to a first bonding member 51, or may be connected to three or more first bonding members 51. The light-emitting element 40 may include a plurality of first electrodes 46 connected to different first bonding members 51. The same applies to the second electrodes 47 and the second bonding members 52.

A semiconductor light-emitting element that can emit light of appropriately selected wavelength can be selected as the light-emitting element 40. In one example, the light-emitting element 40 may be, but not limited to, a light-emitting element that emits blue light, and other light-emitting elements that emit any color other than blue may be used as the light-emitting element 40. When using the plurality of light-emitting elements 40 arranged at predetermined intervals in the light emitting module 1, the light-emitting elements 40 may emit the same color of light, or may emit different colors of light, such as red light, green light, or the like.

A semiconductor layered body 45 of the light-emitting element 40 that can emit blue light may be formed of a nitride-based semiconductor ($In_xAl_yGa_{1-x-y}N$, $0 \leq X$, $0 \leq Y$, $X+Y \leq 1$). In this case, the semiconductor layered body 45 includes a light emitting layer, and an n-type semiconductor layer and a p-type semiconductor layer that are positioned to sandwich the light emitting layer. The electrodes include an n-side electrode and a p-side electrode are electrically connected to the n-type semiconductor layer and the p-type semiconductor layer, respectively. In a plan view, the light-emitting element 40 has any shape, not limited to a rectangular shape, and may be in a polygonal shape such as a triangle or a hexagon.

Furthermore, a wavelength conversion member including a phosphor may be provided on the light-emitting element 40. Examples of the phosphor include YAG phosphors (for example, $(Y, Lu, Gd)_3(Al, Ga)_5O_{12}:Ce$) that emit yellow light, β-sialon phosphors (for example, $(Si, Al)_3(O, N)_4:Eu$) that emit green light, fluoride phosphors (for example, $K_2(Si,Ti,Ge)F_6:Mn$ or $K_2(Si,Al)F_6:Mn$) that emit red light, and nitride phosphors (for example, $(Sr,Ca)AlSiN_3:Eu$). The wavelength conversion member may include a single phosphor, or may include a plurality of phosphors.

Furthermore, a light shielding member may be provided between the light-emitting elements 40. The light shielding member surrounds and covers the lateral surfaces of each of the light-emitting elements 40. The light shielding member is a member that suppresses propagation of light between adjacent light-emitting elements. The light shielding member is preferably disposed between the light-emitting element 40 and the wiring substrate 10. Specifically, the light shielding member is preferably located in the area where the resist layer has been disposed as described above. For example, the light shielding member is a resin including a light reflective material. As the light reflective material, for example, titanium oxide, aluminum oxide, zinc oxide, barium carbonate, barium sulfate, boron nitride, aluminum nitride, glass filler, or the like may preferably be used. As the resin, a silicone resin may be preferably used.

The above-described embodiments have been presented as examples embodying the present invention, but the scope of the present invention is not limited to the described embodiments. For example, the addition, deletion or modification of several components or steps in the above-described embodiment are also included in the present invention.

Embodiments of the present invention can be utilized in, for example, headlights or display devices of vehicles.

What is claimed is:

1. A method for manufacturing a light emitting module, the method comprising:
   providing an intermediate body comprising:
      a wiring substrate comprising a metal layer located at an upper surface of the wiring substrate,
      a first conductive member located on and in contact with the metal layer, and
      a second conductive member separated from the first conductive member and located on and in contact with the metal layer;
   disposing a resist layer on the intermediate body such that at least a portion of the resist layer is located between the first conductive member and the second conductive member;
   disposing a light-emitting element on the resist layer such that a lower surface of the light-emitting element faces the upper surface of the wiring substrate, the light-emitting element comprising:
      a first electrode located at the lower surface of the light-emitting element, and
      a second electrode disposed at the lower surface of the light-emitting element;
   forming on the metal layer:
      a first bonding member in contact with the first conductive member and the first electrode, and
      a second bonding member separated from the first conductive member and in contact with the second conductive member and the second electrode; and
   subsequent to the step of forming the first bonding member and the second bonding member, removing the resist layer.

2. The method for manufacturing the light emitting module, according to claim 1, further comprising:
   subsequent to the step of removing the resist layer, separating the metal layer into a first metal layer in contact with the first conductive member and the first bonding member, and a second metal layer in contact with the second conductive member and the second bonding member, the separating comprising selectively removing the metal layer using the first bonding member and the second bonding member as masks.

3. The method for manufacturing the light emitting module, according to claim 1, wherein:
   the first bonding member and the second bonding member are formed by electrolytic plating.

4. The method for manufacturing the light emitting module, according to claim 1, wherein:
   the step of providing the intermediate body comprises:
      providing the wiring substrate, and
      disposing the first conductive member and the second conductive member on the metal layer.

5. The method for manufacturing the light emitting module, according to claim 4, wherein:
   the first conductive member and the second conductive member are formed by plating, sputtering, or vapor deposition.

6. The method for manufacturing the light emitting module, according to claim 1, wherein:
   the lower surface of the light-emitting element has a rectangular shape, and
   in the step of disposing the light-emitting element, two opposite sides of outer edges of the lower surface of the light-emitting element are in contact with the resist layer.

7. The method for manufacturing the light emitting module, according to claim 1, wherein:
   in the step of providing the intermediate body:
      the wiring substrate has a first recessed portion and a second recessed portion at the upper surface of the metal layer,
      the first conductive member is disposed in the first recessed portion,
      the second conductive member is disposed in the second recessed portion,
      a thickness of the first conductive member is greater than a depth of the first recessed portion, and
      a thickness of the second conductive member is greater than a depth of the second recessed portion.

8. The method for manufacturing the light emitting module, according to claim 1, wherein:
   in the step of disposing the light-emitting element on the resist layer, the resist layer is not in contact with the first electrode and the second electrode of the light-emitting element.

9. A light emitting module comprising:
   a wiring substrate comprising:
      a first metal layer located at an upper surface of the wiring substrate, wherein an upper surface of the first metal layer has a first recessed portion, and
      a second metal layer located at the upper surface of the wiring substrate, wherein an upper surface of the second metal layer has a second recessed portion;
   a first conductive member located on and in contact with the first metal layer, wherein the first conductive member is disposed in the first recessed portion, and a thickness of the first conductive member is greater than a depth of the first recessed portion;
   a second conductive member located on and in contact with the second metal layer, wherein the second conductive member is disposed in the second recessed portion, and a thickness of the second conductive member is greater than a depth of the second recessed portion;
   a first bonding member located on the first metal layer, covering the first conductive member, and in contact with the first metal layer and the first conductive member;
   a second bonding member located on the second metal layer, covering the second conductive member, and in contact with the second metal layer and the second conductive member;
   a first metal film covering a surface of the first bonding member;
   a second metal film covering a surface of the second bonding member; and
   a light-emitting element having a lower surface that faces the upper surface of the wiring substrate, the light-emitting element comprising:
      a first electrode located at the lower surface of the light-emitting element and in contact with the first bonding member, and
      a second electrode located at the lower surface of the light-emitting element and in contact with the second bonding member.

10. The light emitting module according to claim 9, wherein:
    the first bonding member is in contact with the upper surface of the first metal layer and a side surface and an upper surface of the first conductive member, and
    the second bonding member is in contact with the upper surface of the second metal layer and a side surface and an upper surface of the second conductive member.

11. A method for manufacturing a light emitting module, the method comprising:
providing an intermediate body comprising:
a wiring substrate comprising a metal layer located at an upper surface of the wiring substrate,
a first conductive member located on and in contact with the metal layer, and
a second conductive member separated from the first conductive member and located on and in contact with the metal layer;
disposing a resist layer on the intermediate body such that at least a portion of the resist layer is located between the first conductive member and the second conductive member, wherein the resist layer is not in contact with the first conductive member and the second conductive member;
disposing a light-emitting element on the resist layer such that a lower surface of the light-emitting element faces the upper surface of the wiring substrate, the light-emitting element comprising:
a first electrode located at the lower surface of the light-emitting element, and
a second electrode disposed at the lower surface of the light-emitting element;
forming on the metal layer:
a first bonding member in contact with the first conductive member and the first electrode, and
a second bonding member separated from the first conductive member and in contact with the second conductive member and the second electrode; and
removing the resist layer.

12. The method for manufacturing the light emitting module, according to claim 11, further comprising:
subsequent to the step of removing the resist layer, separating the metal layer into a first metal layer in contact with the first conductive member and the first bonding member, and a second metal layer in contact with the second conductive member and the second bonding member, the separating comprising selectively removing the metal layer using the first bonding member and the second bonding member as masks.

13. The method for manufacturing the light emitting module, according to claim 11, wherein:
the first bonding member and the second bonding member are formed by electrolytic plating.

14. The method for manufacturing the light emitting module, according to claim 11, wherein:
the step of providing the intermediate body comprises:
providing the wiring substrate, and
disposing the first conductive member and the second conductive member on the metal layer.

15. The method for manufacturing the light emitting module, according to claim 14, wherein:
the first conductive member and the second conductive member are formed by plating, sputtering, or vapor deposition.

16. The method for manufacturing the light emitting module, according to claim 11, wherein:
the lower surface of the light-emitting element has a rectangular shape, and
in the step of disposing the light-emitting element, two opposite sides of outer edges of the lower surface of the light-emitting element are in contact with the resist layer.

17. The method for manufacturing the light emitting module, according to claim 11, wherein:
in the step of providing the intermediate body:
the wiring substrate has a first recessed portion and a second recessed portion at the upper surface of the metal layer,
the first conductive member is disposed in the first recessed portion,
the second conductive member is disposed in the second recessed portion,
a thickness of the first conductive member is greater than a depth of the first recessed portion, and
a thickness of the second conductive member is greater than a depth of the second recessed portion.

18. The method for manufacturing the light emitting module, according to claim 11, wherein:
in the step of disposing the light-emitting element on the resist layer, the resist layer is not in contact with the first electrode and the second electrode of the light-emitting element.

* * * * *